(12) United States Patent
Chen et al.

(10) Patent No.: US 8,072,018 B2
(45) Date of Patent: Dec. 6, 2011

(54) SEMICONDUCTOR DEVICE AND METHOD FOR FABRICATING THE SAME

(75) Inventors: Wei-Su Chen, Hsinchu (TW); Ming-Jinn Tsai, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 825 days.

(21) Appl. No.: 11/966,726

(22) Filed: Dec. 28, 2007

(65) Prior Publication Data
US 2009/0008695 A1 Jan. 8, 2009

(30) Foreign Application Priority Data

Jul. 5, 2007 (TW) ............................... 96124452 A

(51) Int. Cl.
*H01L 29/788* (2006.01)
(52) U.S. Cl. .............................. 257/315; 257/E27.103
(58) Field of Classification Search .................. 257/315, 257/E27.103
See application file for complete search history.

(56) References Cited

U.S. PATENT DOCUMENTS

| 7,005,350 | B2 | 2/2006 | Walker et al. |
| 2002/0134755 | A1 | 9/2002 | Goto et al. |
| 2003/0207585 | A1 | 11/2003 | Choi et al. |
| 2006/0001077 | A1 | 1/2006 | Ryu et al. |
| 2006/0017088 | A1 | 1/2006 | Abbott et al. |
| 2008/0073635 | A1 | 3/2008 | Kiyotoshi et al. |
| 2008/0259687 | A1* | 10/2008 | Specht et al. ............ 365/185.17 |

FOREIGN PATENT DOCUMENTS

| CN | 1901232 A | 1/2007 |
| TW | 200713520 | 4/2007 |

OTHER PUBLICATIONS

B.E.E. Kastenmeier et al., "Highly selective etching of silicon nitride over silicon and silicon dioxide", J. Vac. Sci. Technol. A 17(6), Nov./Dec. 1999, p. 3179-3184, US.
Seung-bum Kim et al., "Study on self-aligned contact oxide etching using $C_5F_8/O_2/Ar$ and $C_5F_8/O_2/Ar/CH_2F_2$ plasma", J. Vac. Sci. Technol. A 23(4), Jul./Aug. 2005, p. 953-958, US.
Masahiro Ooka et al., "Contact-Hole Etching with $NH_3$-Added $C_5F_8$ Pulse-Modulated Plasma", Jpn. J. Appl. Phys., vol. 44, No. 9A, Sep. 8, 2005, p. 6476-6480, Japan.
Taiwan Patent Office, Notice of Allowance, Patent Application Serial No. 096124452, Jan. 28, 2011, Taiwan.

* cited by examiner

*Primary Examiner* — Colleen Matthews

(57) ABSTRACT

A semiconductor device is provided. The semiconductor device comprises a substrate. A lamination structure is on the substrate along a first direction. The lamination structure comprises a plurality of conductive layers arranged from bottom to top and separated from each other, and each of the conductive layers has a channel region and an adjacent source/drain doped region along the first direction. A first gate structure is on a sidewall of the channel region of each conductive layer. The first gate structure comprises an inner first gate insulating layer and an outer first gate conductive layer.

14 Claims, 35 Drawing Sheets

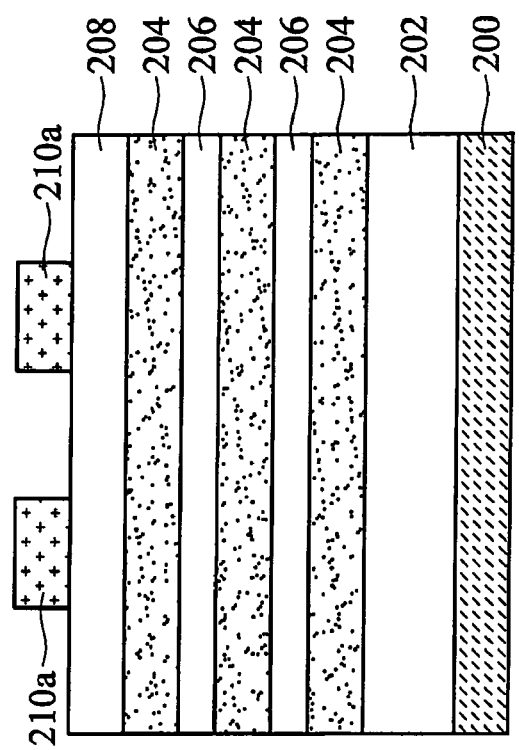
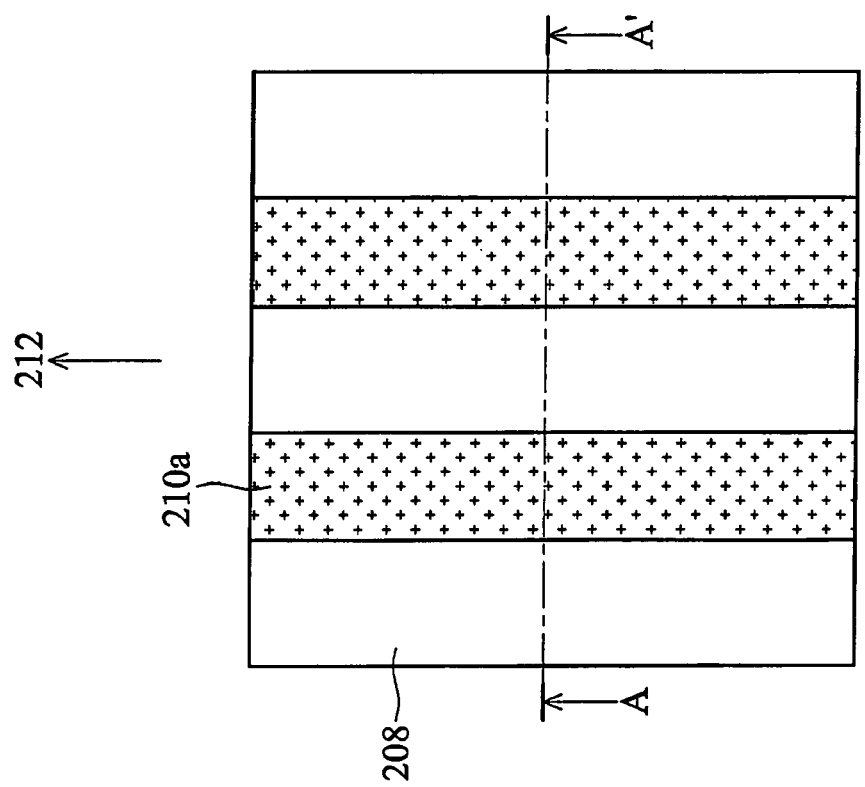
FIG. 4b
FIG. 4a

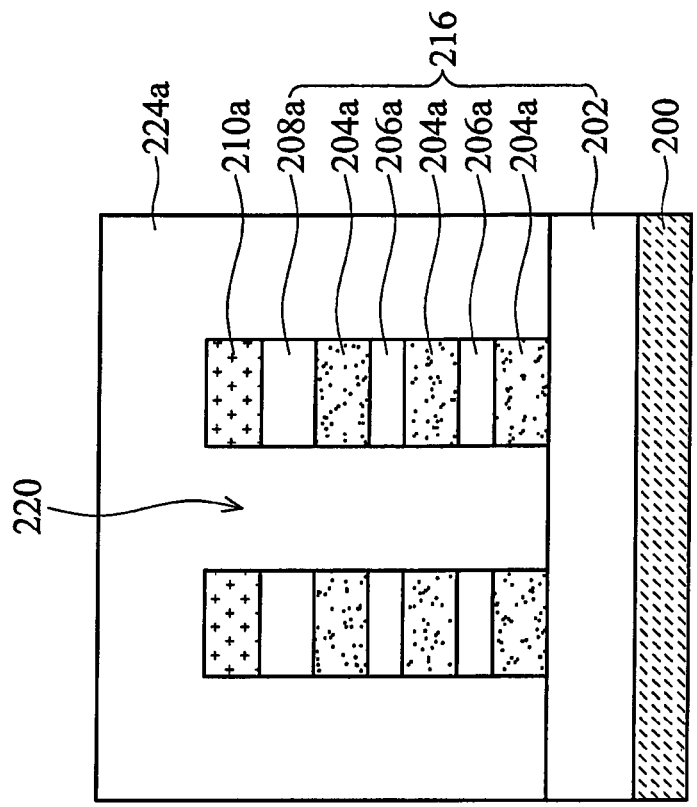
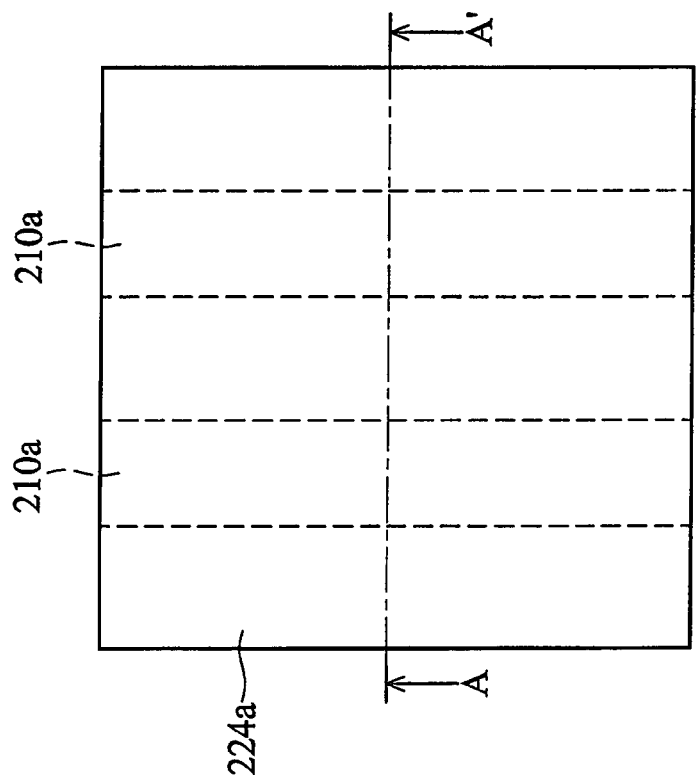
FIG. 7b
FIG. 7a

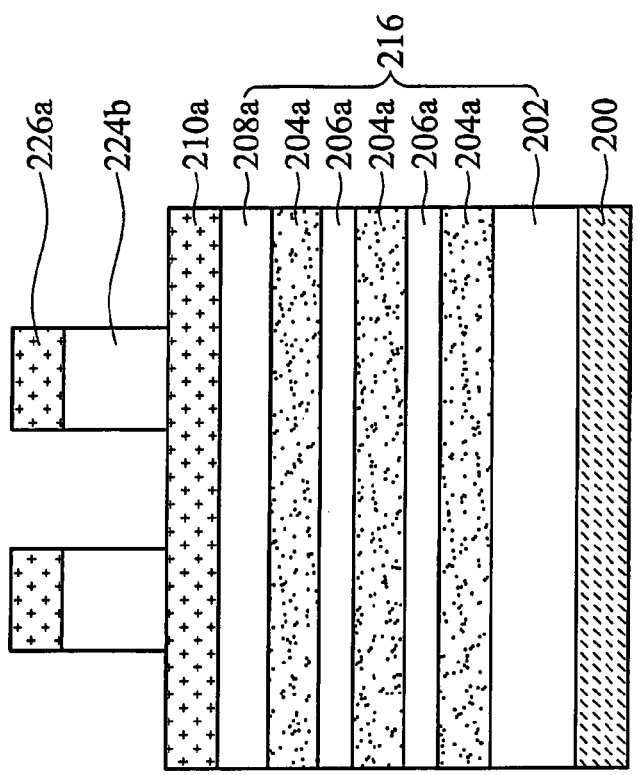
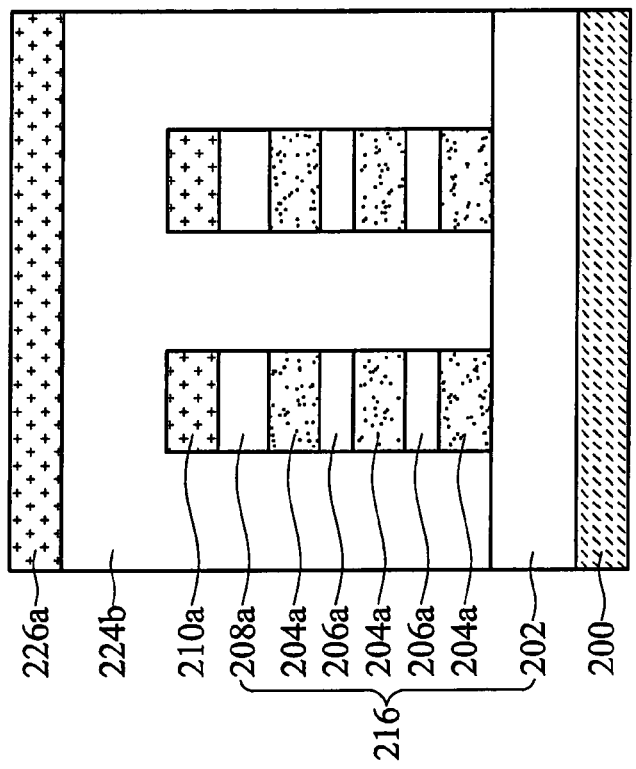
FIG. 10c
FIG. 10b

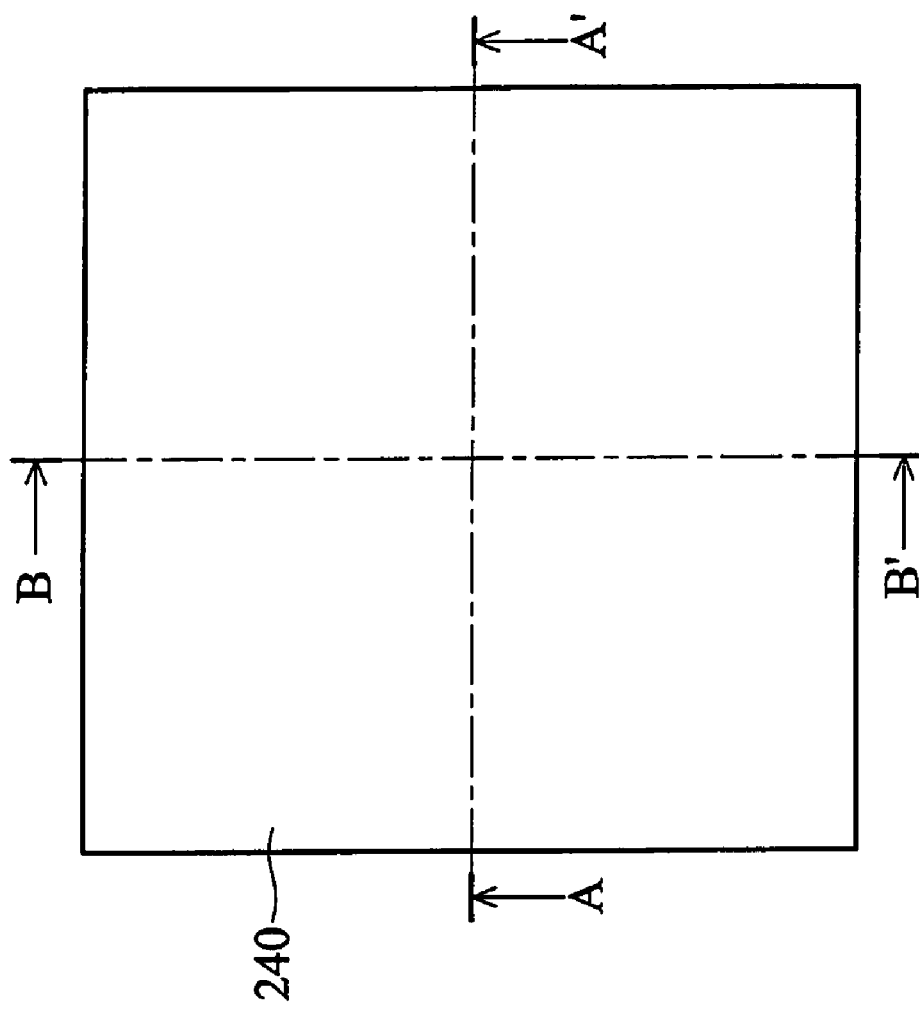

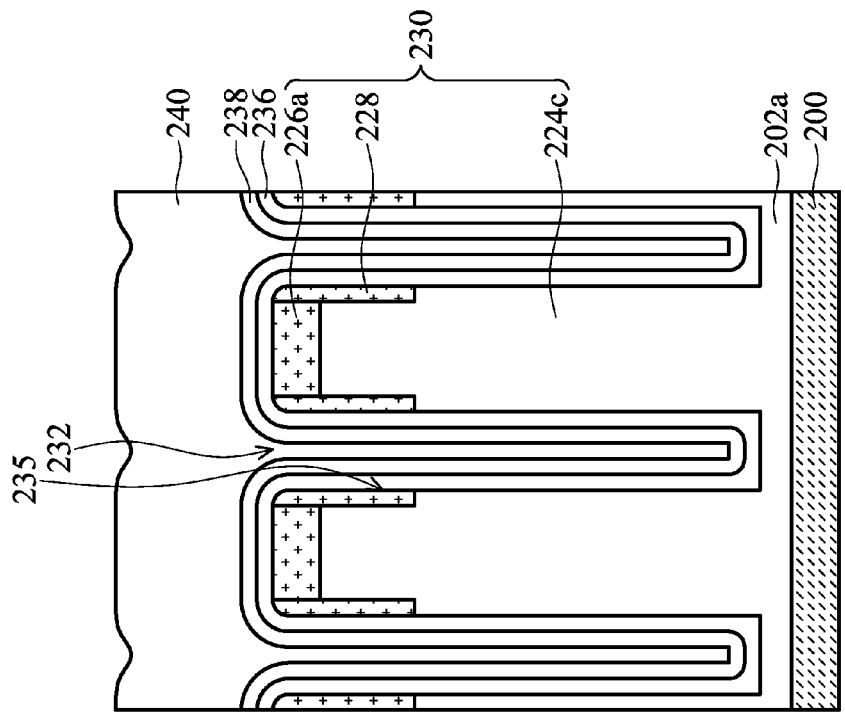
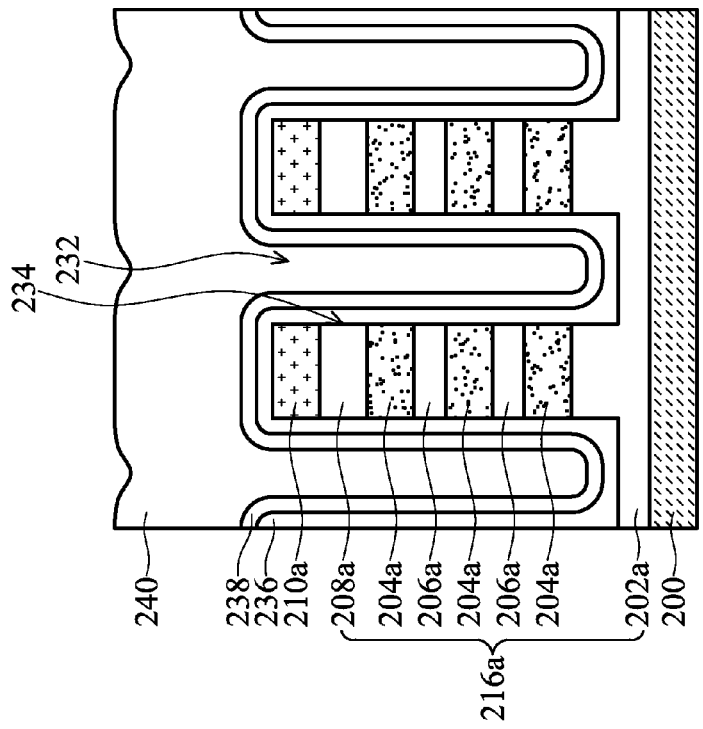
FIG. 13c
FIG. 13b

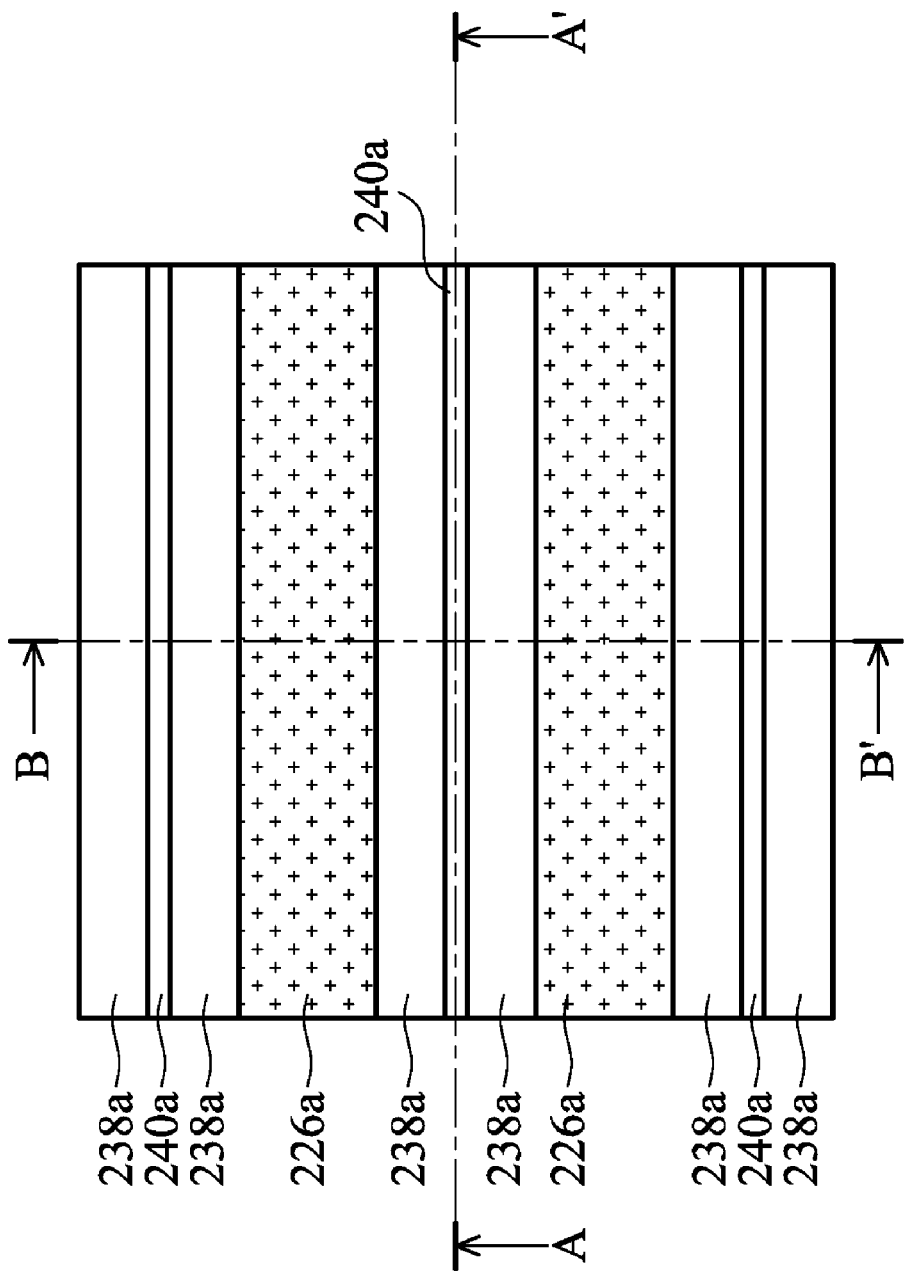

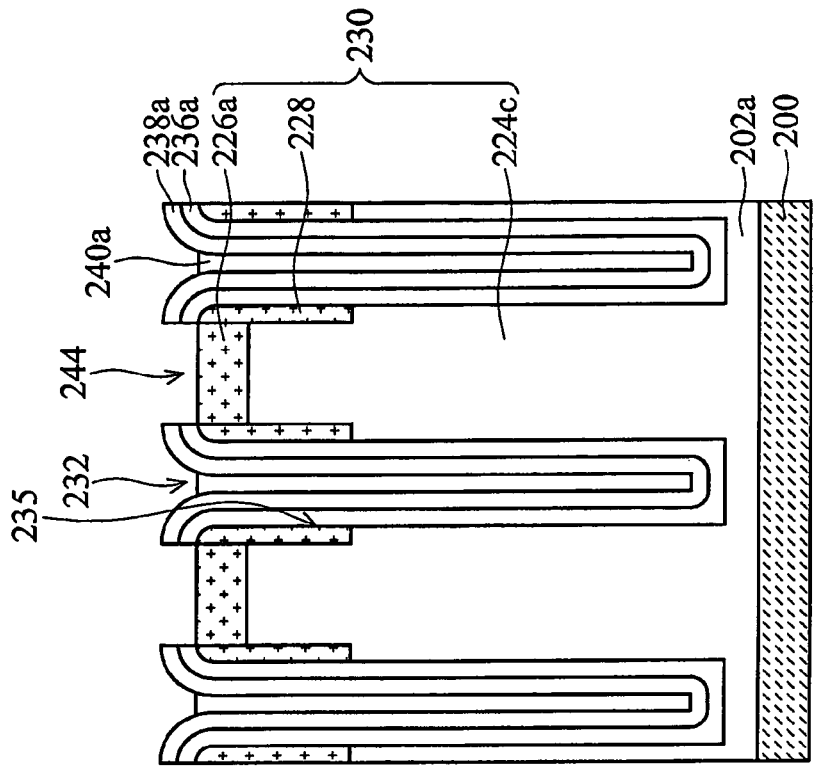
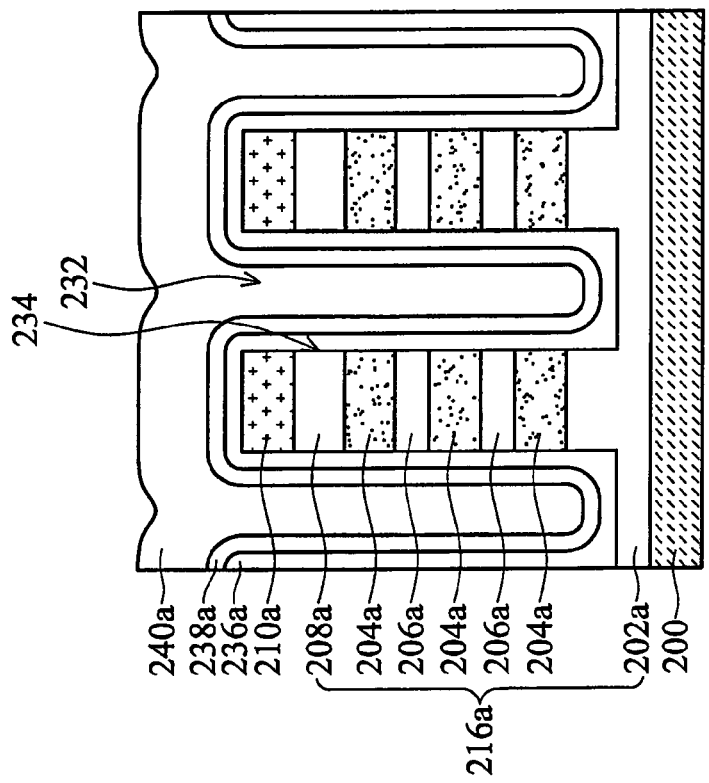
FIG. 14c
FIG. 14b

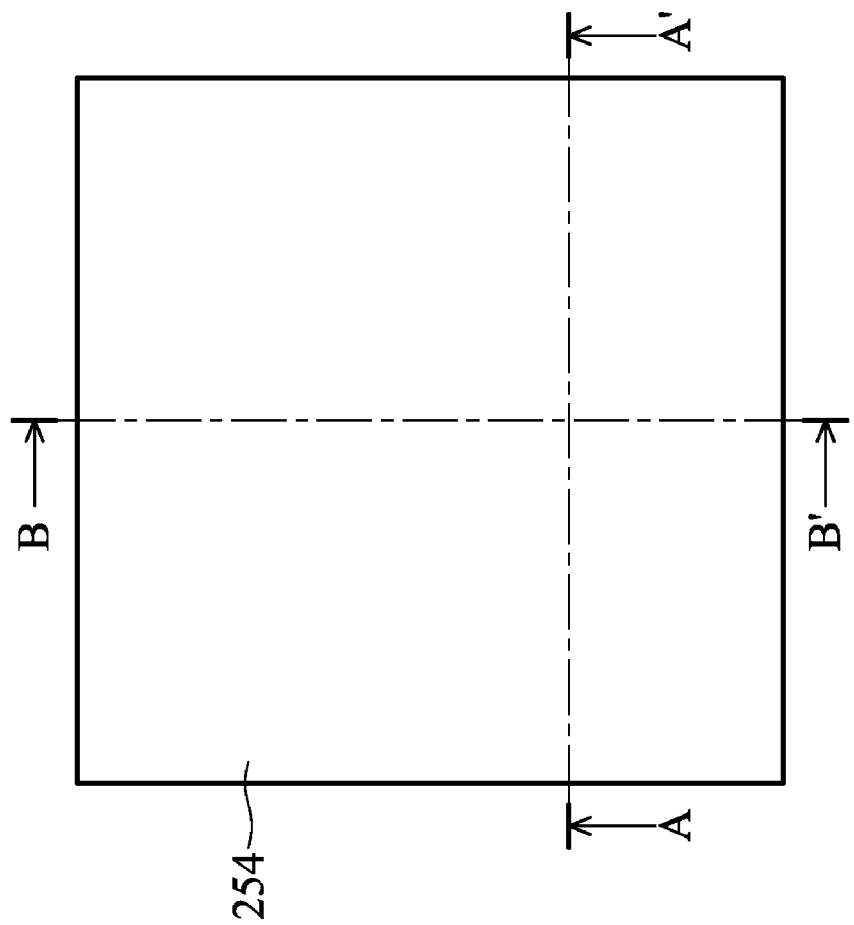

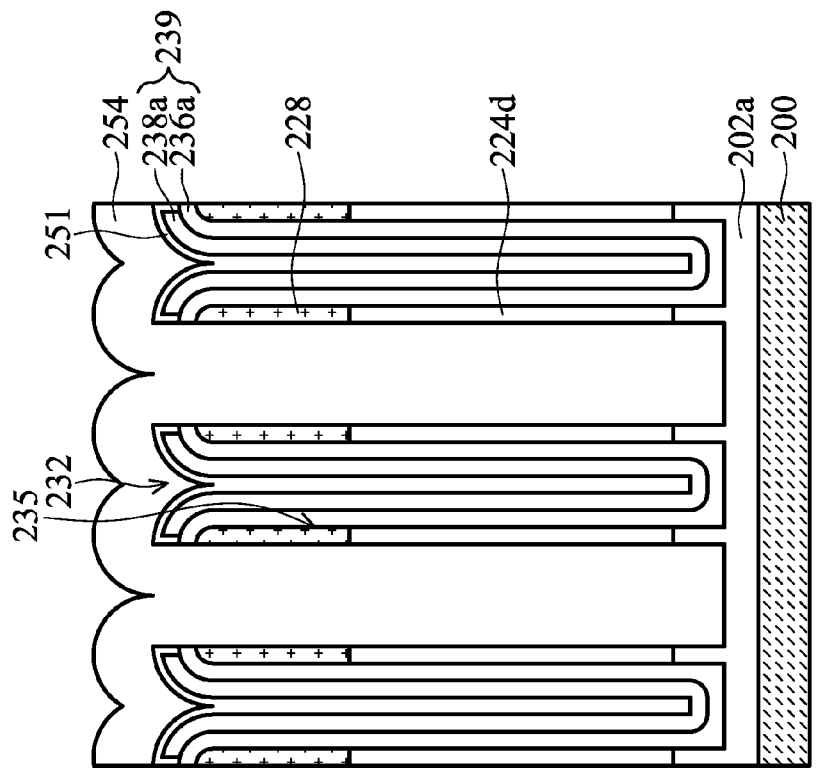
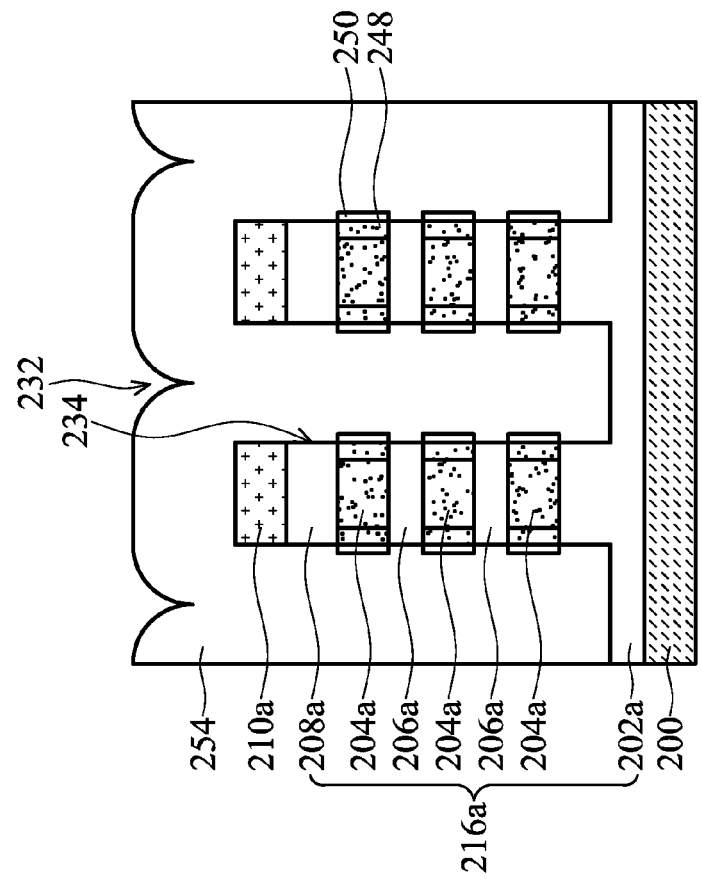
FIG. 18c
FIG. 18b

US 8,072,018 B2

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a semiconductor device with a relatively higher device density and a method for fabricating the same.

2. Description of the Related Art

Three dimensional (3D) integrated circuits (ICs) and fabricating processes thereof are important for circuit density and electronic performances of devices, such as, logic devices or memory devices. Concepts of conventional ICs, however, follow two dimensional (2D) fabricating processes. U.S. Pat. No. 7,005,350 B2 a conventional 3D flash memory array 100 shown in FIG. 1. A first level memory array 1 is formed. The first level memory array 1 mainly comprises a channel stripe 102, an oxide-nitride-oxide (ONO) layer 104, a word line stack 106 and a source/drain region 110. A second level memory array 2 is then formed after forming the first level memory array 1. Elements of the second level memory array 2 are substantially the same as the first level memory array 1. Thus, a formation of the conventional 3D flash memory array 100 is completed. Amount of masking procedures for the conventional 3D flash memory array, however, are increased due to memory array lamination. The memory array lamination of the conventional 3D flash memory array 100 is performed by repeatedly laminating the first level memory array 1. Fabricating cost of the conventional 3D flash memory array 100 can mainly be reduced by saving a substrate area due to each memory array level process has the same fabricating cost. Additionally, gate oxide quality and silicide contact resistance of the first level memory array 1 of the conventional 3D flash memory array 100 may be hindered by thermal budget when forming the upper second level memory array 2; resulting in electronic performances of the first level memory array 1 and the second level memory array 2 to be different. Moreover, the second level memory array 2 channel layer can not be subjected to a high temperature annealing process to achieve higher carrier mobility, for example, higher than 1000° C., due to damage to the first level memory array 1 metal interconnects. Therefore, an additional compensation method is used to keep the same electronic performance of each memory array level for the conventional 3D flash memory array.

Thus, a semiconductor device with higher device density and the same device electronic performances is desirable.

BRIEF SUMMARY OF INVENTION

The invention provides a semiconductor device and method for fabricating the same. An exemplary embodiment of a semiconductor device comprises a substrate and a lamination structure on the substrate along a first direction, wherein the lamination structure comprises a plurality of conductive layers arranged from bottom to top and separated from each other, and each of the conductive layers has a channel region and an adjacent source/drain region along the first direction. In addition, the semiconductor device comprises a first gate structure on a sidewall of the channel region of each conductive layer, wherein the first gate structure comprises an inner first gate insulating layer and an outer first gate conductive layer.

The invention further provides a method for fabricating a semiconductor device comprising providing a substrate and a lamination structure formed on the substrate along a first direction, wherein the lamination structure comprises a plurality of conductive layers arranged from bottom to top and separated from each other, and each of the conductive layers has a first region and an adjacent second region along the first direction. In addition, the method for fabricating a semiconductor device comprises a first gate structure conformably formed covering the first region of each conductive layer, wherein the first gate structure comprises an inner first gate insulating layer and an outer first gate conductive layer. Meanwhile, a plurality of source/drain regions is also formed on each side of the first gate structure.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 2a, 3a, 4a, 5a, 6a, 7a, 8a, 9a, 10a, 11a, 12a, 13a, 14a, 15a, 16a, 17a, 18a and 19a show top views of an exemplary embodiment of a semiconductor device according to the invention.

FIGS. 2b, 3b, 4b, 5b, 6b, 7b, 8b, 9b, 10b, 11b, 12b, 13b, 14b, 15b, 16b, 17b, 18b and 19b show cross sections taken along line A-A' of FIGS. 2a, 3a, 4a, 5a, 6a, 7a, 8a, 9a, 10a, 11a, 12a, 13a, 14a, 15a, 16a, 17a, 18a and 19a, respectively.

FIGS. 10c, 11c, 12c, 13c, 14c, 15c, 16c, 17c, 18c and 19c show cross sections taken along line B-B' of FIGS. 10a, 11a, 12a, 13a, 14a, 15a, 16a, 17a, 18a and 19a.

FIG. 5c shows a top view taken along line B-B' of FIG. 5a.

DETAILED DESCRIPTION OF INVENTION

Figure 1:
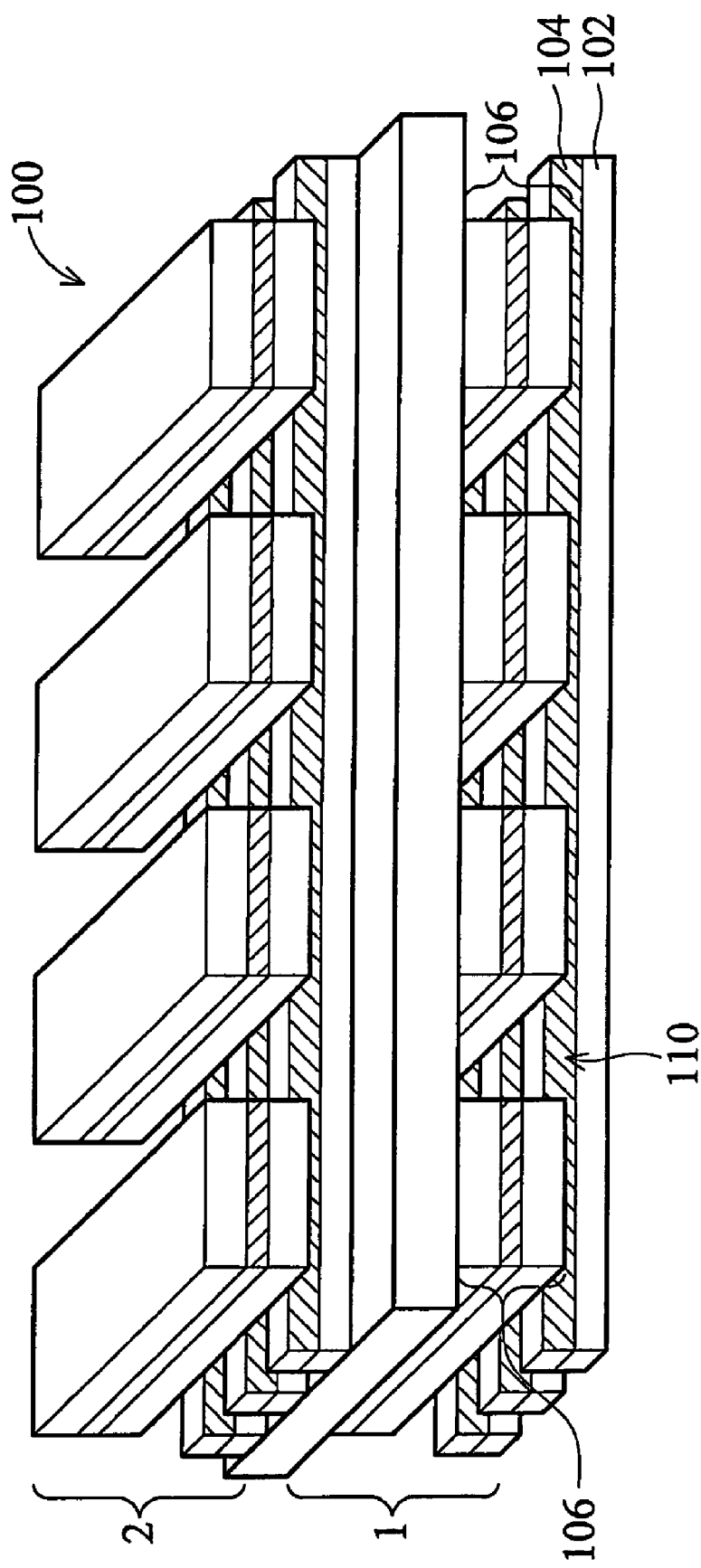
FIG. 1 shows a conventional semiconductor device.

The following description is of the best-contemplated mode of carrying out the invention. This description is made for the purpose of illustrating the general principles of the invention and should not be taken in a limiting sense. The scope of the invention is best determined by reference to the appended claims.

FIGS. 2a, 3a, 4a, 5a, 6a, 7a, 8a, 9a, 10a, 11a, 12a, 13a, 14a, 15a, 16a, 17a, 18a and 19a show top views of an exemplary embodiment of a semiconductor device of the invention. FIGS. 2b, 3b, 4b, 5b, 6b, 7b, 8b, 9b, 10b, 11b, 12b, 13b, 14b, 15b, 16b, 17b, 18b and 19b show cross sections taken along line A-A' of FIGS. 2a, 3a, 4a, 5a, 6a, 7a, 8a, 9a, 10a, 11a, 12a, 13a, 14a, 15a, 16a, 17a, 18a and 19a, respectively. FIGS. 10c, 11c, 12c, 13c, 14c, 15c, 16c, 17c, 18c and 19c show cross sections taken along line B-B' of FIGS. 10a, 11a, 12a, 13a, 14a, 15a, 16a, 17a, 18a and 19a. FIG. 5c shows a top view taken along line B-B' of FIG. 5a. FIGS. 15d, 16d, 17d and 19d show cross sections taken along line C-C' of FIGS. 15b, 16b, 17b and 19b. Wherever possible, the same reference numbers are used in the drawings and the descriptions of the same or like parts.

Figure 2B:
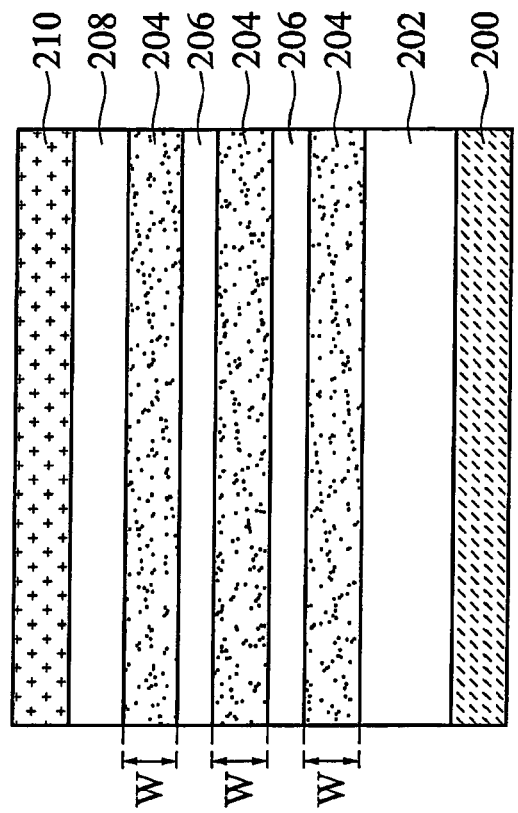
Figure 2A:
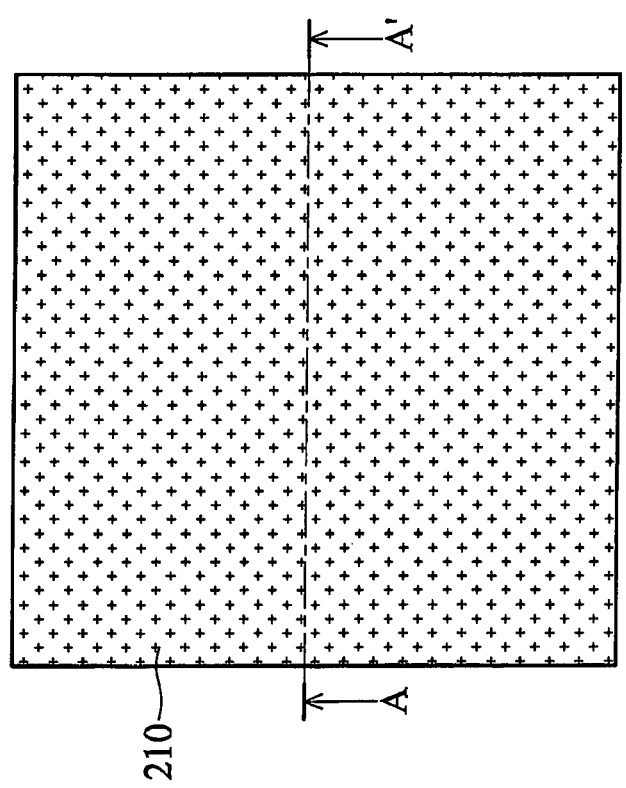

FIG. 2a illustrates a top view of an exemplary embodiment of a semiconductor device according to the invention. FIG. 2b shows a cross section of the semiconductor device taken along line A-A' of FIG. 2a. In the exemplary embodiment of a semiconductor device according to the invention, a substrate 200 is provided. The substrate 200 may comprise silicon. In alternative embodiments, SiGe, bulk semiconductor, strained semiconductor, compound semiconductor, silicon on insulator (SOI), and other commonly used semiconductor substrates can be used for the substrate 200.

Next, a bottom insulating layer 202, conductive layers 204, insulating layers 206 and a top insulating layer 208 are formed by alternative stacking on the substrate 200. The bottom insulating layer 202 covers the substrate 200. Any two of the adjacent conductive layers 204 are separated by one of the insulating layers 206. The bottom insulating layer 202, the conductive layers 204, the insulating layers 206 and the top insulating layer 208 may be formed by a deposition process, such as low pressure chemical vapor deposition (LPCVD). In one embodiment, the bottom insulating layer 202, the insulating layers 206 and the top insulating layer 208 may comprise silicon dioxide ($SiO_2$), silicon nitride ($Si_3N_4$) or the like. The conductive layer 204 may comprise a single crystalline semiconductor layer, a polycrystalline semiconductor layer or an amorphous semiconductor layer, such as a single crystalline silicon layer, a polysilicon layer or an amorphous silicon layer. The conductive layer 204 may comprise an n-type impurities doped semiconductor layer or a p-type impurities doped semiconductor layer. The n-type impurities may comprise phosphorous (P) or arsenic (As), and the p-type impurities may comprise boron (B) or difluoroborane ($BF_2$). The conductive layer 204 has a width W used to define a channel width of an exemplary embodiment of the semiconductor device according to the invention.

Next, a first patterned hard masking layer 210 is formed on the top insulating layer 208. The first patterned hard masking layer 210 may be formed by a deposition process, such as chemical vapor deposition (CVD). The first patterned hard masking layer 210 may comprise silicon dioxide ($SiO_2$), silicon nitride ($Si_3N_4$) or the like. The first patterned hard masking layer 210 may have an etching selectivity of about 20 to 10000 with the underlying top insulating layer 208, the bottom insulating layer 202 and the insulating layer 206. In one embodiment, when the first hard masking layer 210 is silicon nitride ($Si_3N_4$), the bottom insulating layer 202, the insulating layer 206 and the top insulating layer 208 are silicon dioxide ($SiO_2$). Alternatively, when the first hard masking layer 210 is silicon dioxide ($SiO_2$), the bottom insulating layer 202, the insulating layer 206 and the top insulating layer 208 are silicon nitride ($Si_3N_4$).

Figure 3B:
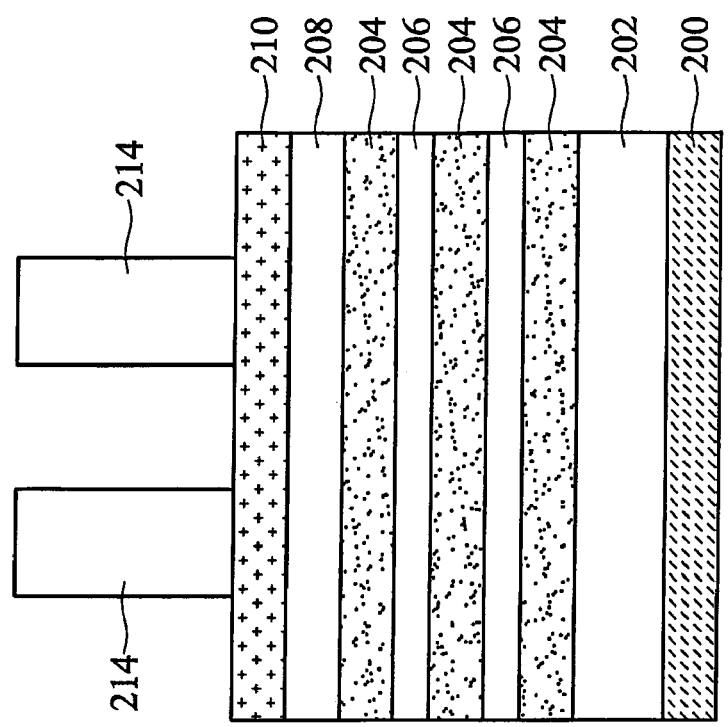
Figure 3A:
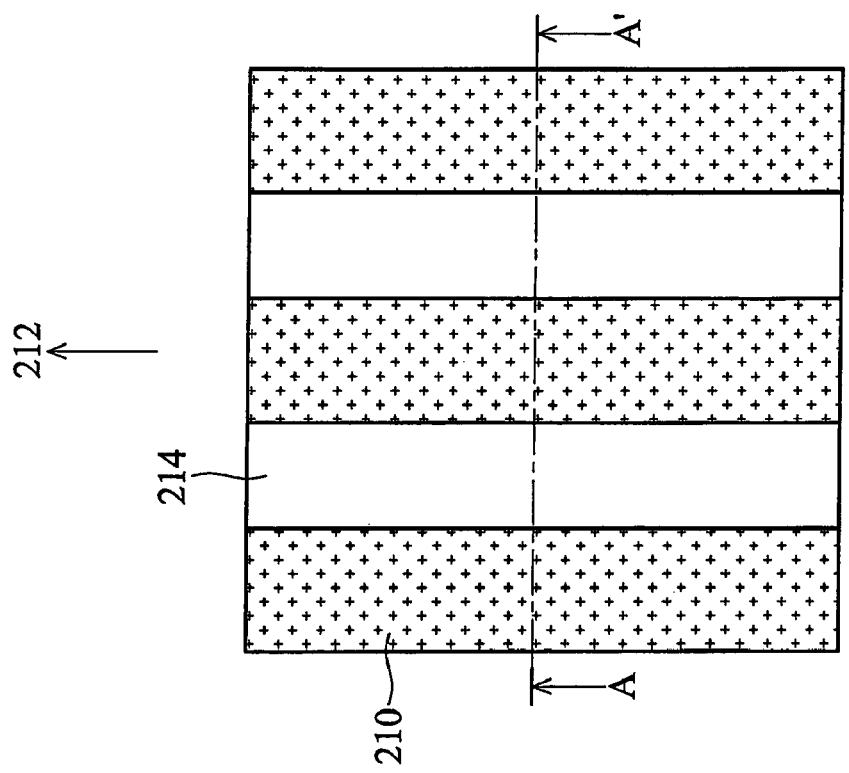

As shown in FIGS. 3a and 3b, a photoresist layer 214 is formed along a first direction 212 covering a portion of the first hard masking layer 210. As shown in FIGS. 4a and 4b, an anisotropic etching process is then performed to remove the first hard masking layer 210 not covered by the photoresist layer 214. Next, the photoresist layer 214 is removed to form a plurality of patterned first hard masking layers 210a. Because the first patterned hard masking layer 210 has an etching selectivity of about 20 to 10000 with the underlying top insulating layer 208, the first hard masking layer 210 not covered by the photoresist layer 214 is removed without damaging the underlying top insulating layer 208. After performing the aforementioned process, the patterned first hard masking layers 210a are formed on the top insulating layer 208 along the first direction 212, covering a portion of the top insulating layer 208. Spacing between the adjacent first hard masking layers 210a is controlled by the critical distance (CD) resolution of the photolithography process without dimensional limitations.

Figure 5B:
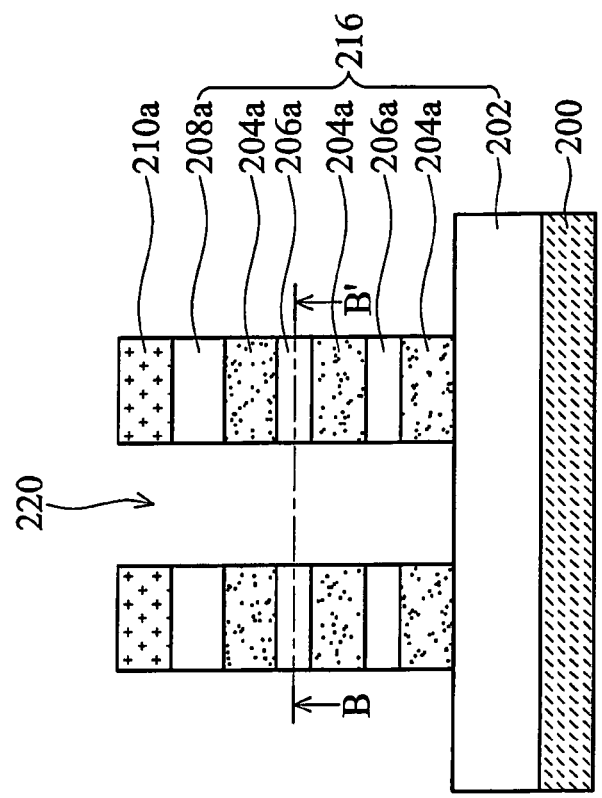
Figure 5A:
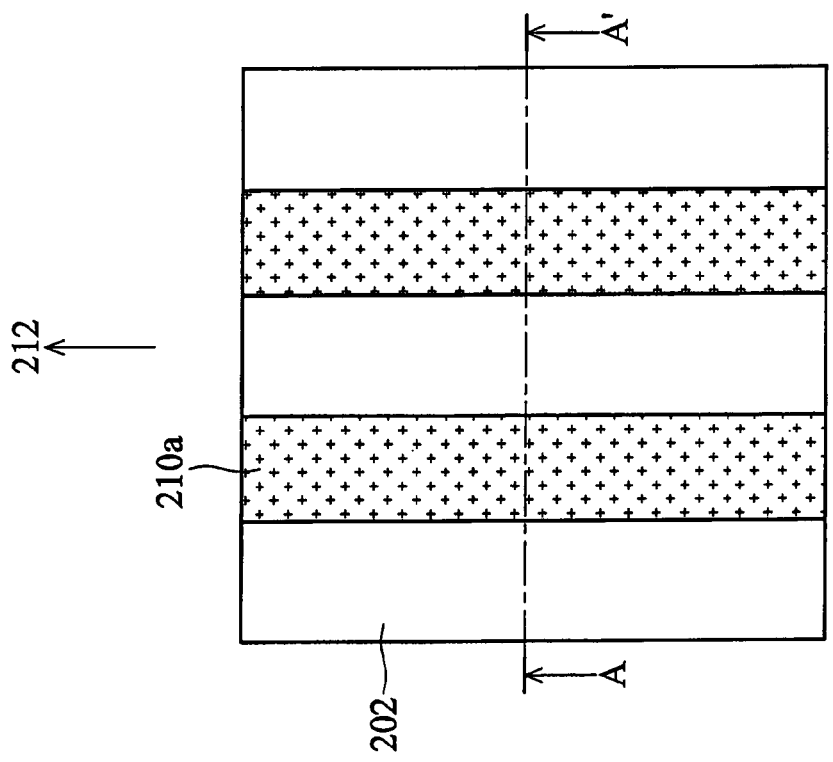
Figure 5C:
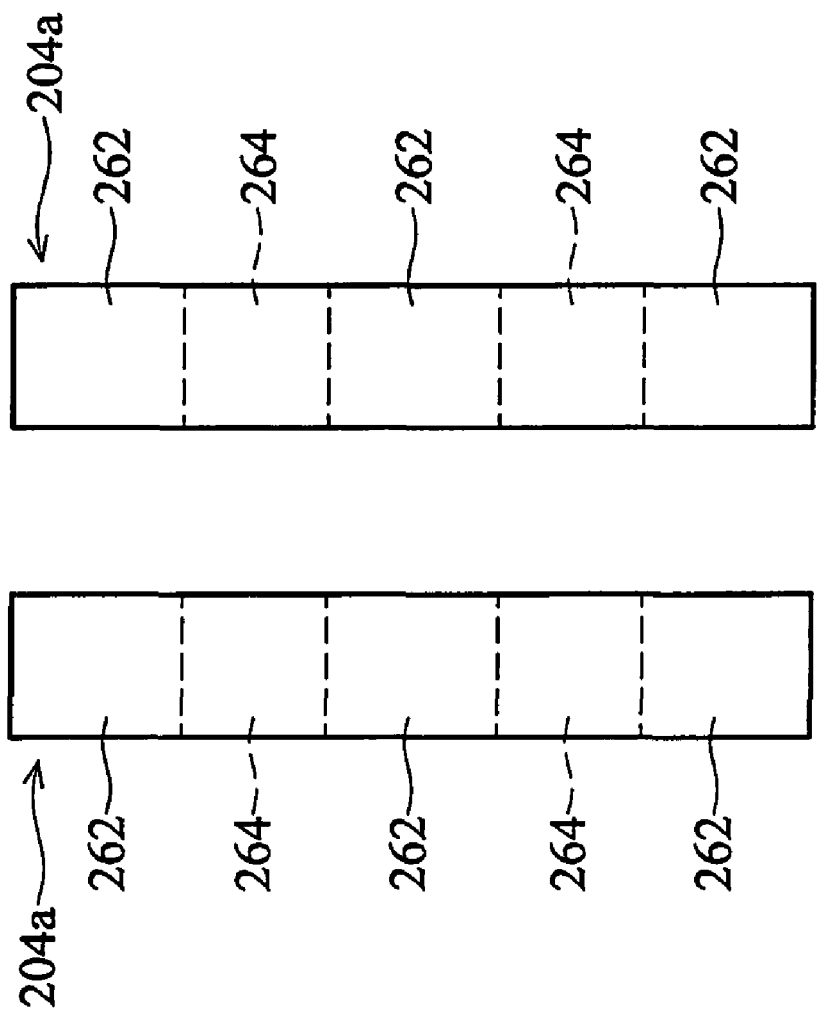

Referring to FIGS. 5a, 5b and 5c, an anisotropic etching process is then performed to remove a portion of the top insulating layer 208, the insulating layer 206 and the conductive layer 204, which are not covered by the patterned first hard masking layers 210a, until the bottom insulating layer 202 is exposed using the first hard masking layers 210a as masks. After performing the anisotropic etching process, a trench 220 is formed. Because the top insulating layer 208 has a higher etching selectivity, for example, about 20 to 10000, with the above first hard masking layer 210 and the underlying conductive layer 204, respectively. Similarly, the insulating layer 206 has a higher etching selectivity, for example, about 20 to 10000, with the above first hard masking layer 210 and the adjacent conductive layer 204, respectively. A lamination structure 216 may be formed by removing a portion of the top insulating layer 208, the insulating layer 206 and the conductive layer 204 using an anisotropic etching process, which is performed in the same etching machine with selected proper etching gases of the top insulating layer 208, the insulating layer 206 and the conductive layer 204, respectively. The lamination structure 216 comprises the top insulating layer 208a, the insulating layer 206a, the conductive layer 204a and the bottom insulating layer 202. Any two of the adjacent conductive layers 204a are separated by one of the insulating layers 206a. The bottom insulating layer 202 covers the substrate 200. FIG. 5c shows a top view of each separated conductive layer 204a. The conductive layer 204a comprises a first area 262 and an adjacent second area 264 along the first direction 212.

Figure 6B:
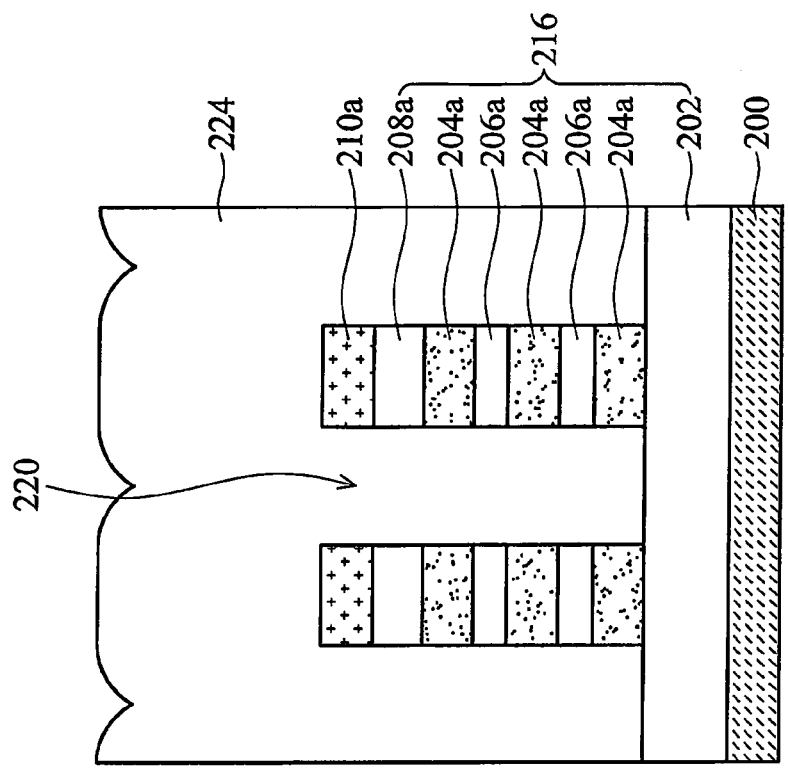
Figure 6A:
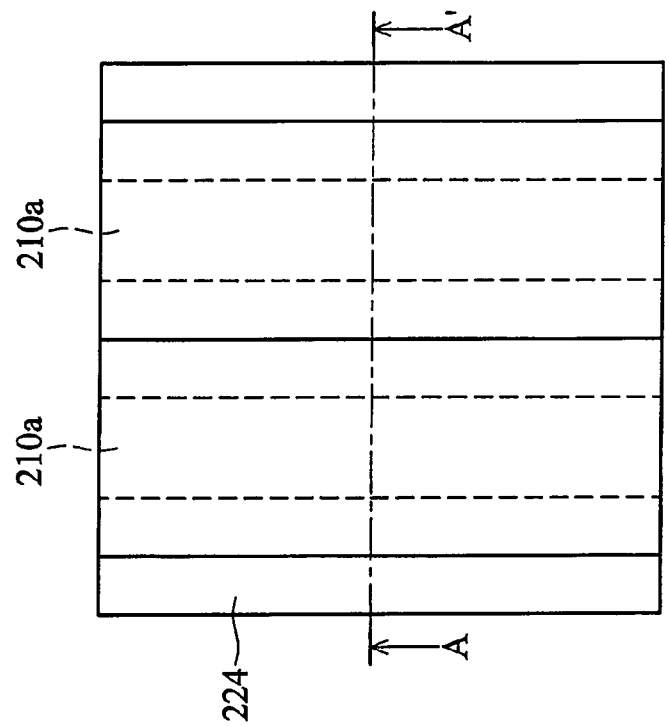

Referring to FIGS. 6a and 6b, a supporting insulating layer 224 is blanketly formed on the patterned first insulating layer 210a and the lamination structure 216, filling the trench 220. The supporting insulating layer 224 may be formed by a deposition process, such as low pressure chemical vapor deposition (LPCVD). The supporting insulating layer 224 may comprise silicon dioxide ($SiO_2$), silicon nitride ($Si_3N_4$) or the like. Next, referring to FIGS. 7a and 7b, a planarization process is performed to remove a portion of the supporting insulating layer 224 to form a supporting insulating layer 224a having a planar surface. In one embodiment, the planarization process may comprise chemical mechanical polishing (CMP).

Figure 8B:
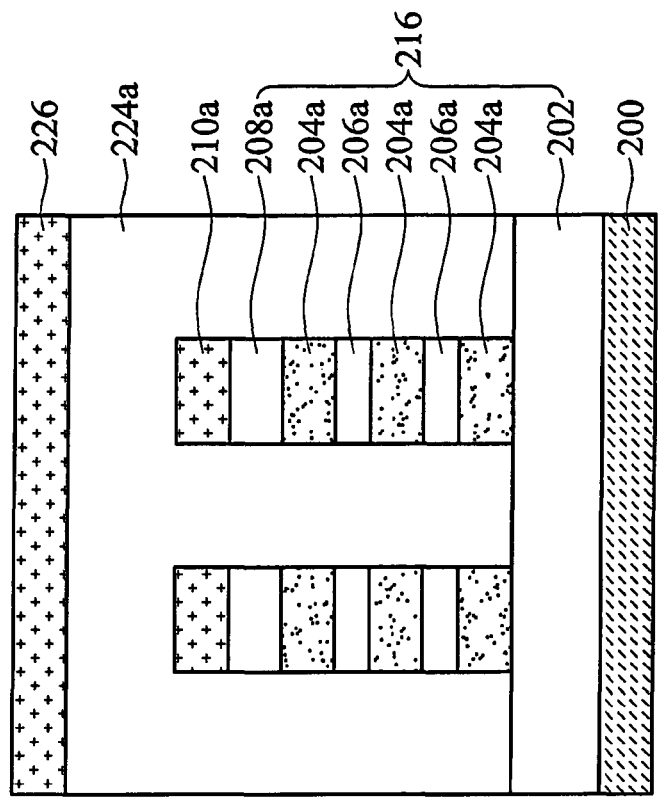
Figure 8A:
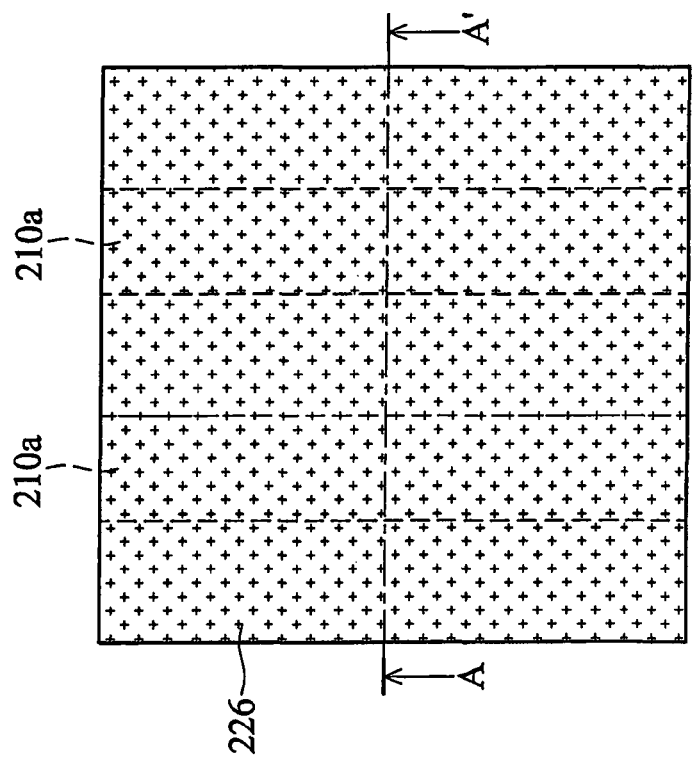

Referring to FIGS. 8a and 8b, a second hard masking layer 226 is formed on supporting insulating layer 224a. The second hard masking layer 226 may be formed by a deposition process, such as chemical vapor deposition (CVD). The second hard masking layer 226 may comprise silicon dioxide ($SiO_2$), silicon nitride ($Si_3N_4$) or the like. The second hard masking layer 226 may have an etching selectivity of about 20 to 10000 with the underlying supporting insulating layer 224a. In one embodiment, when the second hard masking layer 226 is silicon nitride ($Si_3N_4$), the supporting insulating layer 224a is silicon dioxide ($SiO_2$). Alternatively, when the second hard masking layer 226 is silicon dioxide ($SiO_2$), the supporting insulating layer 224a is silicon nitride ($Si_3N_4$).

Figure 9B:
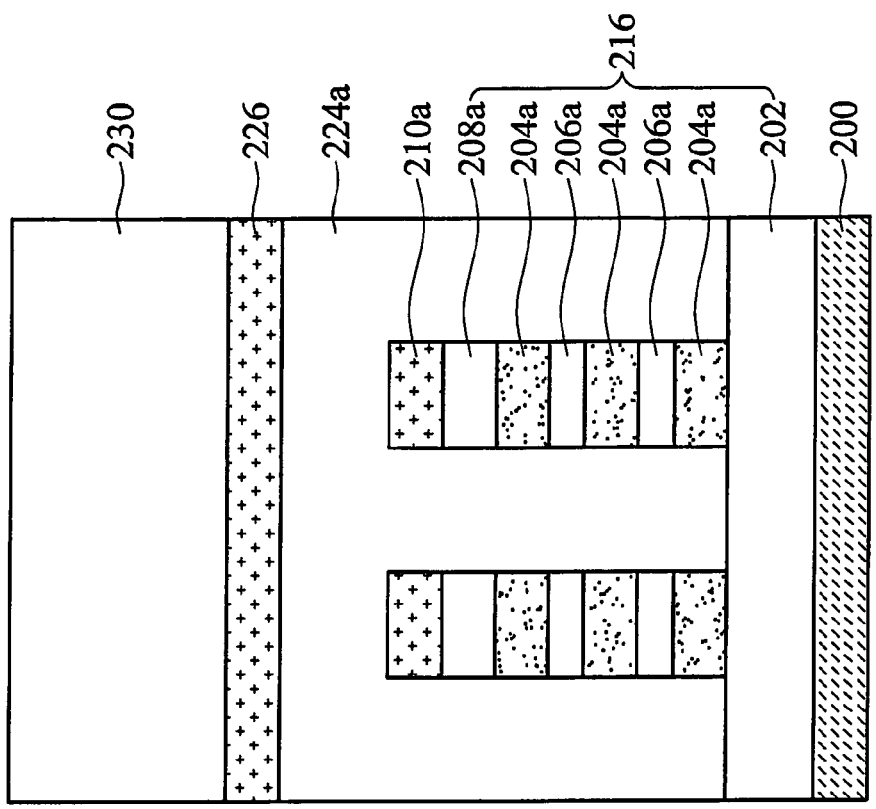
Figure 9A:
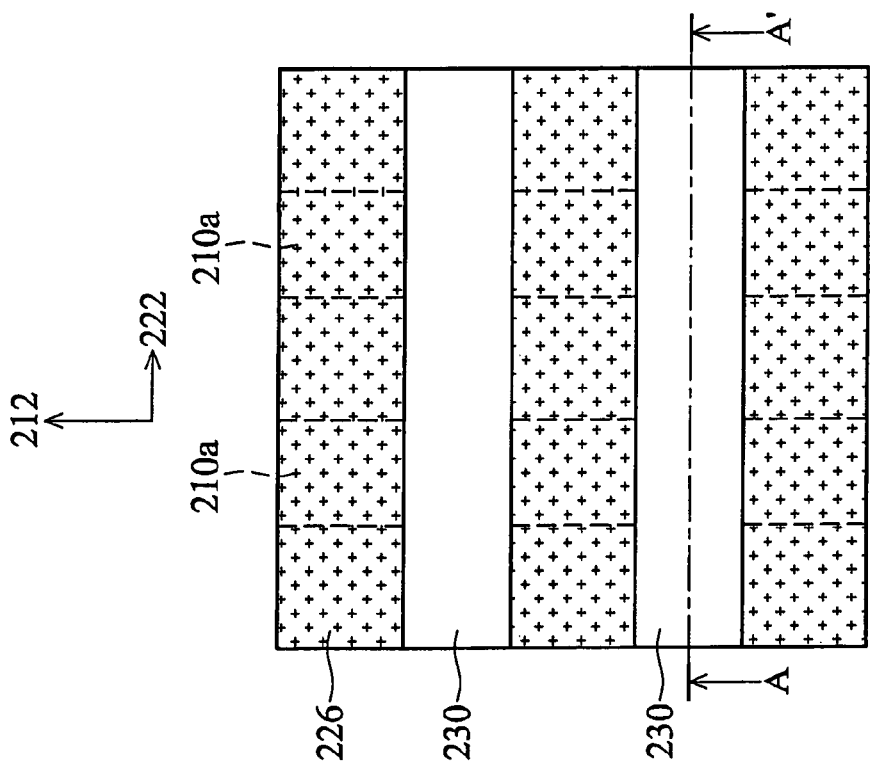

As shown in FIGS. 9a and 9b, a photoresist layer 230 is formed along a second direction 222 covering a portion of the second hard masking layer 226. In one embodiment, the photoresist layer 230 is directly on the second area of the conductive layer 204a as shown in FIG. 5c. The second direction 222 is substantially perpendicular to the first direction 212.

Figure 10A:
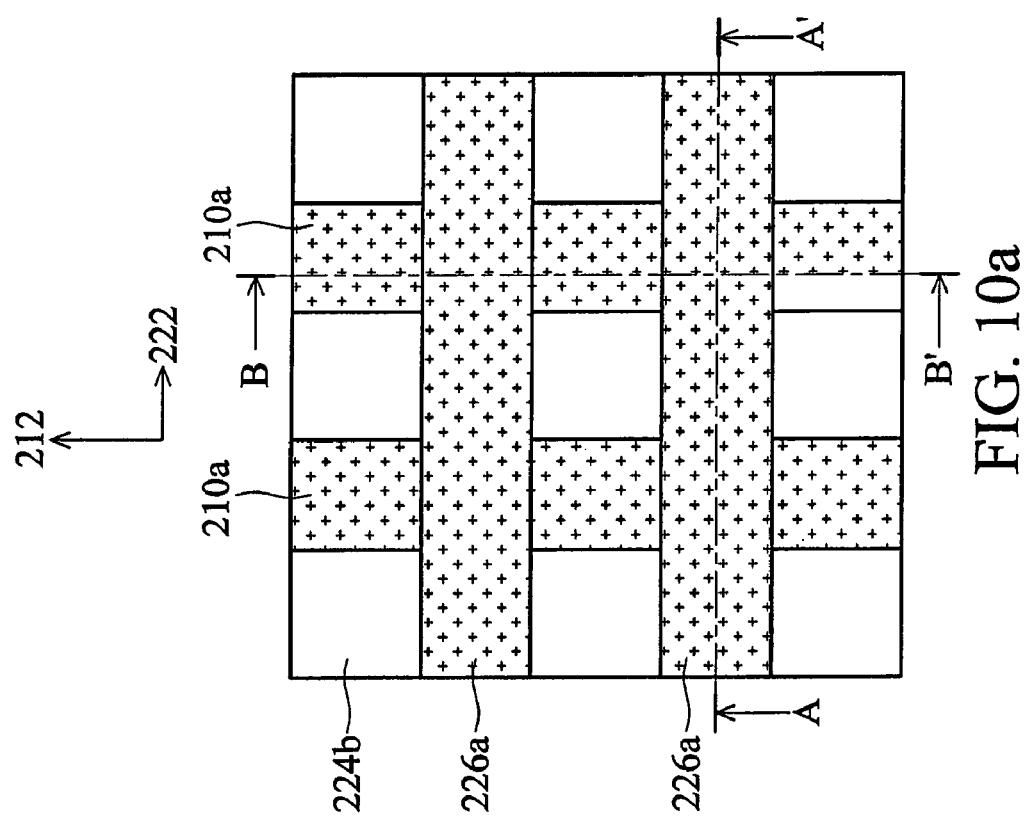

As shown in FIGS. 10a, 10b and 10c, an anisotropic etching process is then performed to remove the second hard masking layer 226 not covered by the photoresist layer 230. Next, the photoresist layer 230 is removed to form a plurality of patterned second hard masking layers 226a. In one embodiment, the patterned second hard masking layers 226a is directly on the second area 264 of the conductive layer 204a as shown in FIG. 5c. Because of the second hard masking layer 226 has an etching selectivity of about 20 to 10000 with the underlying supporting insulating layer 224a. A plurality of the patterned second hard masking layers 226a are formed without damaging the underlying supporting insulating layer 224a. After performing the aforementioned process, the patterned second hard masking layers 226a are formed on the supporting insulating layer 224a along the second direction 222, covering a portion of the supporting insulating layer 224a. Spacing between the adjacent second hard masking layers 226a is controlled by the critical distance (CD) resolution of the photolithography process without dimensional limitations.

Next, an anisotropic etching process is then performed to remove a portion of the supporting insulating layer 224a not covered by the patterned second hard masking layers 226a, until the patterned first hard masking layers 210a is exposed using the patterned second hard masking layers 226a as masks. After performing the anisotropic etching process, a supporting insulating layer 224b is formed. Because of the supporting insulating layer 224a has a higher etching selectivity, for example, about 20 to 10000, with the above second hard masking layers 226 and the underlying patterned first hard masking layers 210a, the patterned second hard masking layers 226a and the supporting insulating layer 224b are thus formed by removing a portion of the second hard masking layers 226 and the supporting insulating layer 224a using an anisotropic etching process, which is performed in the same etching machine with selected proper etching gases of the second hard masking layers 226 and the supporting insulating layer 224a.

Figure 11A:
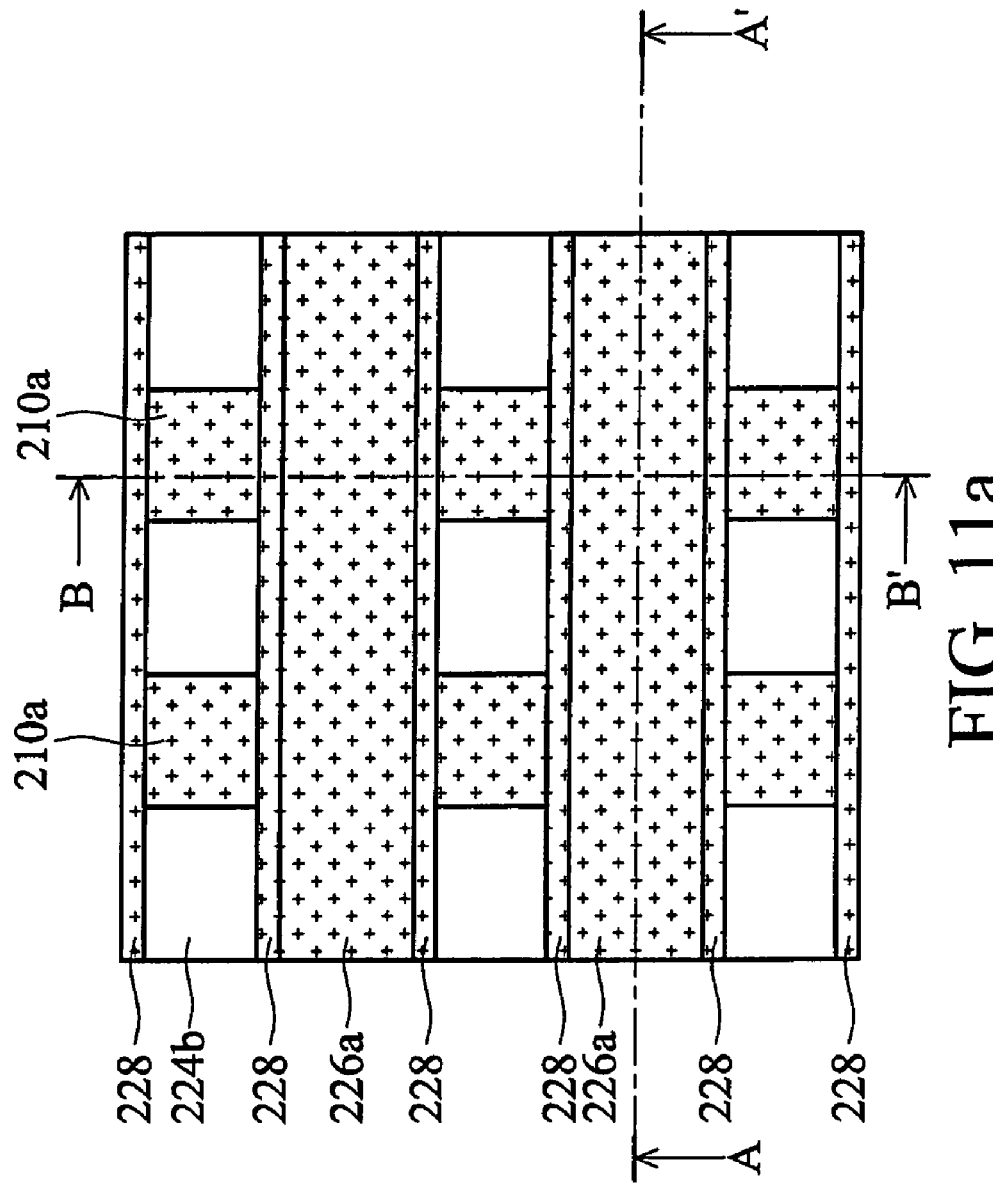
Figure 11C:
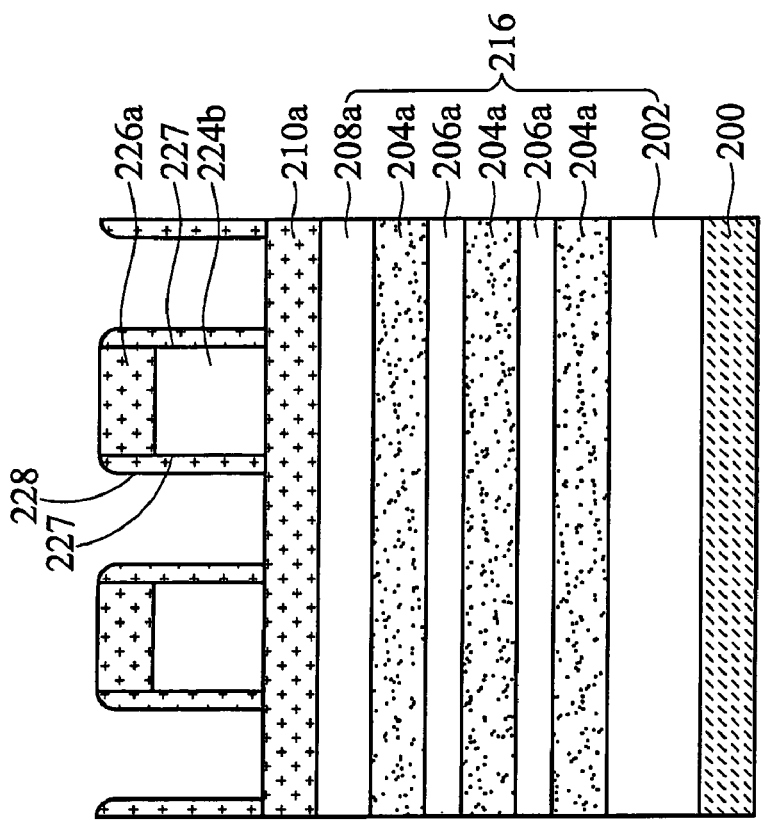
Figure 11B:
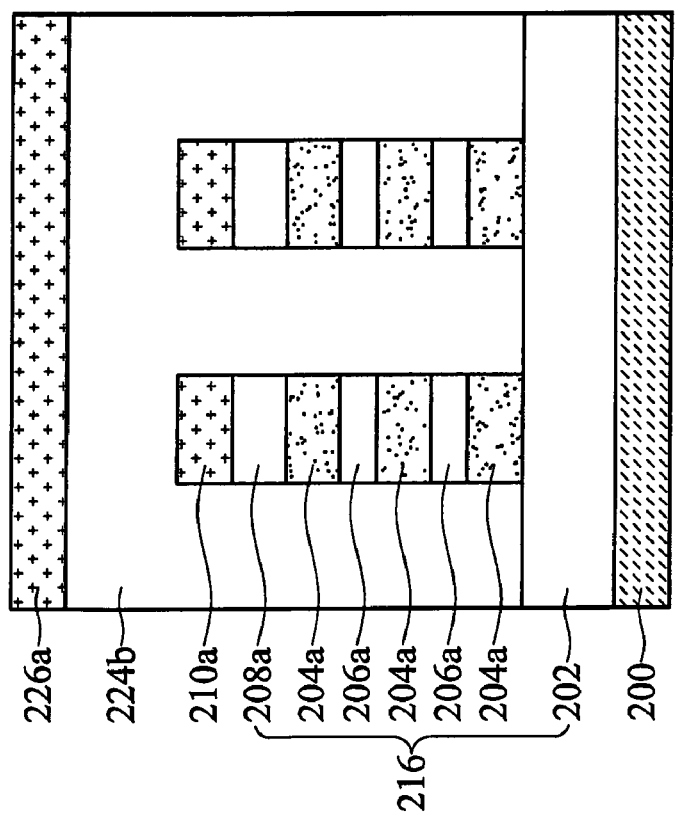

Referring to FIGS. 11a, 11b and 11c, the first insulating spacers 228 are formed on a sidewall 227 of the supporting insulating layer 224b between the first patterned hard masking layer 210a and the second patterned hard masking layer 226a. In one embodiment, an insulating layer may be conformably formed on the first patterned hard masking layer 210a, the second patterned hard masking layer 226a and the supporting insulating layer 224b by a deposition process, such as chemical vapor deposition (CVD). The first insulating spacers 228 are thus formed by an anisotropic etching process, which removes a portion of the insulating layer on top of the first patterned hard masking layer 210a, the second patterned hard masking layer 226a and the supporting insulating layer 224b.

Figure 12A:
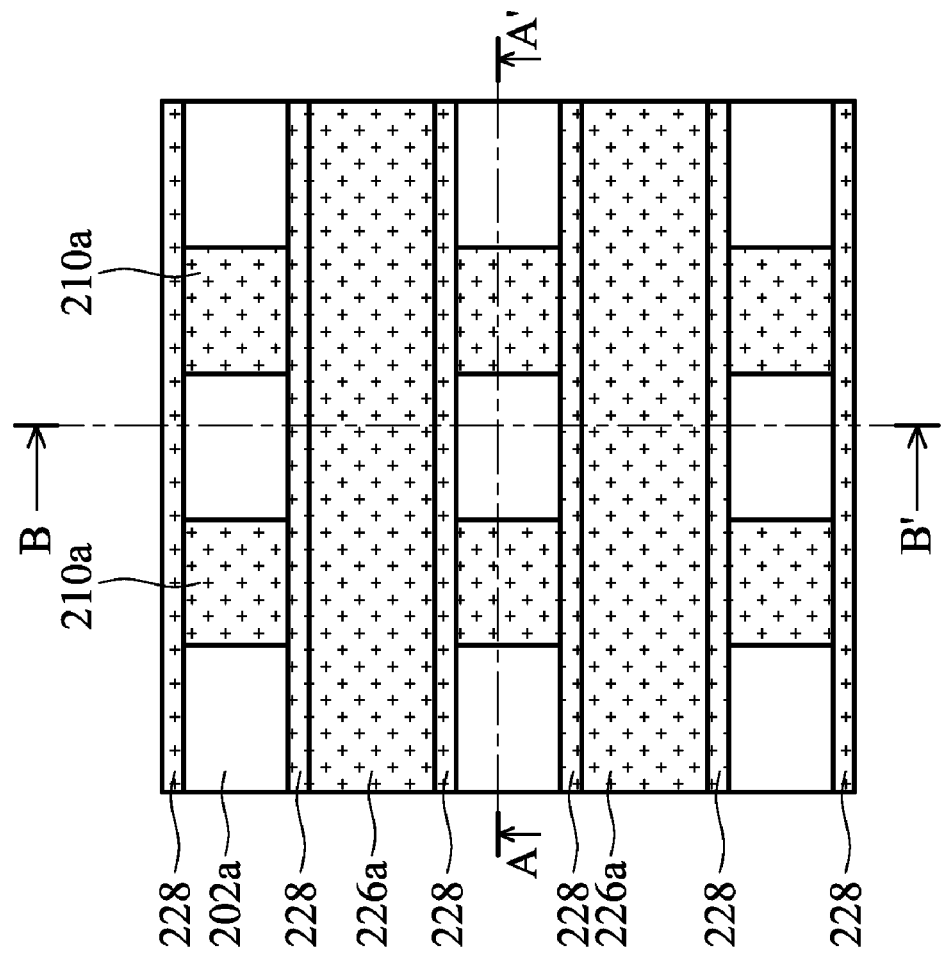
Figure 12C:
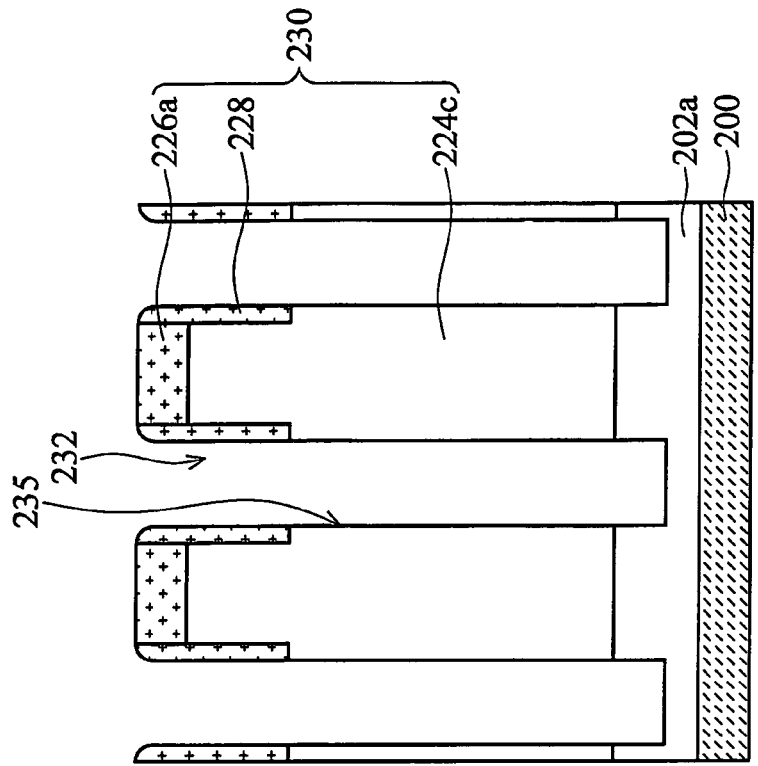
Figure 12B:
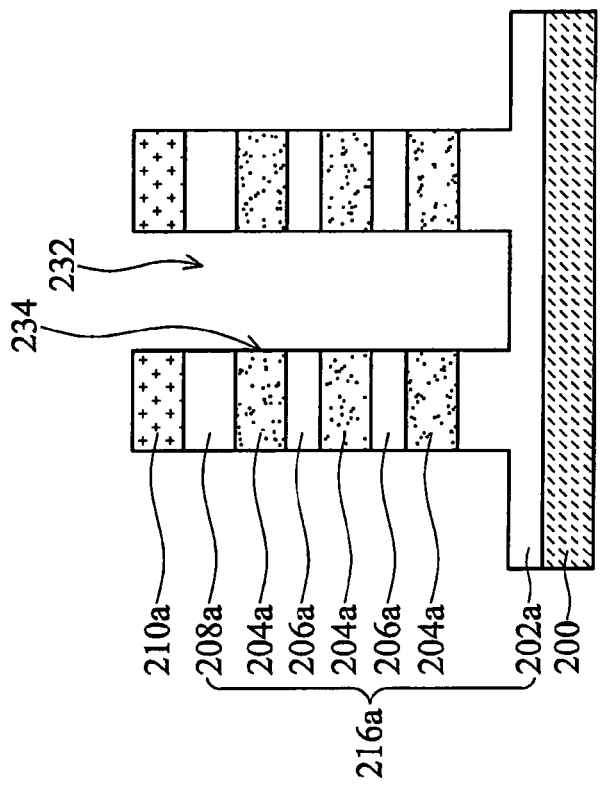

Referring to FIGS. 12a, 12b and 12c, a anisotropic etching process, which uses the first patterned hard masking layer 210a, the second patterned hard masking layer 226a and the first insulating spacer 228 as masks, is performed to remove a portion of the supporting insulating layer 224b and a portion of the bottom insulating layer 202 to form a supporting structure 230, a lamination structure 216a and a trench 232. The supporting structure 230 comprises second patterned hard masking layer 226a, the first insulating spacer 228 and the supporting insulating layer 224c. The lamination structure 216a comprises the top insulating layer 208a, the insulating layer 206a, the conductive layer 204a and the bottom insulating layer 202a.

Referring to FIGS. 13a, 13b and 13c, an inner first gate insulating layer 236 and an outer first gate conductive layer 238 are conformably formed on the lamination structure 216a and the supporting structure 230, covering a sidewall 234 of the lamination structure 216a and a sidewall 235 of the supporting structure 230 in sequence, respectively. The first gate insulating layer 236 may be formed by a deposition process, such as, low pressure chemical vapor deposition (LPCVD) or atomic layer chemical vapor deposition (ALD). The first gate insulating layer 236 may comprise silicon dioxide ($SiO_2$), oxide-nitride-oxide (ONO), nitride-oxide (NO) or silicon nitride ($Si_3N_4$). Alternatively, the first gate insulating layer 236 may also comprise high dielectric constant (k) (k>8) dielectric materials, such as, aluminum oxide ($Al_2O_3$), hafnium oxide ($HfO_x$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof. In this embodiment, the first gate insulating layer 236 may be a composite layer by laminating three insulating layers, for example, a top insulating layer, a middle insulating layer and a bottom insulating layer, serving as a floating gate insulating layer, a floating gate layer and an inter-gate dielectric layer of a memory device, respectively. The middle insulating layer may have higher electron/hole trap energy levels than the top and bottom insulating layers. Also, conduction band and valance band energy levels of the middle insulating layer may be design as a charge trapping insulating layer. In one embodiment, the first gate insulating layer 236 may comprise oxide-nitride-oxide (ONO). In alternative embodiments, the first gate insulating layer 236 comprising silicon dioxide ($SiO_2$), nitride-oxide (NO), tantalum oxide ($Ta_2O_5$) or silicon nitride ($Si_3N_4$) may serve as a gate insulating layer of a semiconductor device. The first gate conductive layer 238 may be formed by a deposition process, such as, low pressure chemical vapor deposition (LPCVD). The first gate conductive layer 238 may comprise a single crystalline semiconductor layer, a polycrystalline semiconductor layer or an amorphous semiconductor layer, such as a single crystalline silicon layer, a polysilicon layer or an amorphous silicon layer. The first gate conductive layer 238 may comprise an n-type impurities doped semiconductor layer or a p-type impurities doped semiconductor layer. The n-type impurities may comprise phosphorous (P) or arsenic (As), and the p-type impurities may comprise boron (B) or difluoroborane ($BF_2$). The conductive type of the first gate conductive layer 238 may be different from that of the conductive layer 204a of the lamination structure 216a. In this embodiment, the first gate conductive layer 238 may serve as a control gate layer of a memory device. Alternatively, the first gate conductive layer 238 may serve as a gate layer of a semiconductor device. Next, an insulating layer 240 is blanketly formed, filling the trench 232. The insulating layer 240 may be formed by a deposition process such as low pressure chemical vapor deposition (LPCVD). The insulating layer 240 may comprise silicon dioxide ($SiO_2$), tantalum oxide ($Ta_2O_5$) or silicon nitride ($Si_3N_4$).

Referring to FIGS. 14a, 14b and 14c, a portion of the insulating layer 240, a portion of the first gate insulating layer 236 and a portion of the first gate conductive layer 238, which are formed on top of the second patterned hard masking layer, are removed to form openings 244. Firstly, a portion of the insulating layer 240 is removed by a process, such as an etching back process, until the first gate conductive layer is exposed. Next, using the remaining insulating layer 240 as an etching hard mask, a portion of the first gate conductive layer 238 on top of the patterned second hard masking layer 226a is removed to form a first gate conductive layer 238a. A gate insulating layer 236a and an insulating layer 240a on top of the patterned second hard masking layer 226a are formed by removing a portion of the first gate insulating layer 236 and the remaining insulating layer 240, using the first gate conductive layer 238a as an etching hard mask, until the top of the patterned second hard masking layer 226a is exposed. The aforementioned fabricating processes of the first gate conductive layer 238a, the gate insulating layer 236a and the insulating layer 240a may be performed in the same etching machine with selected proper etching gases.

Figure 15A:
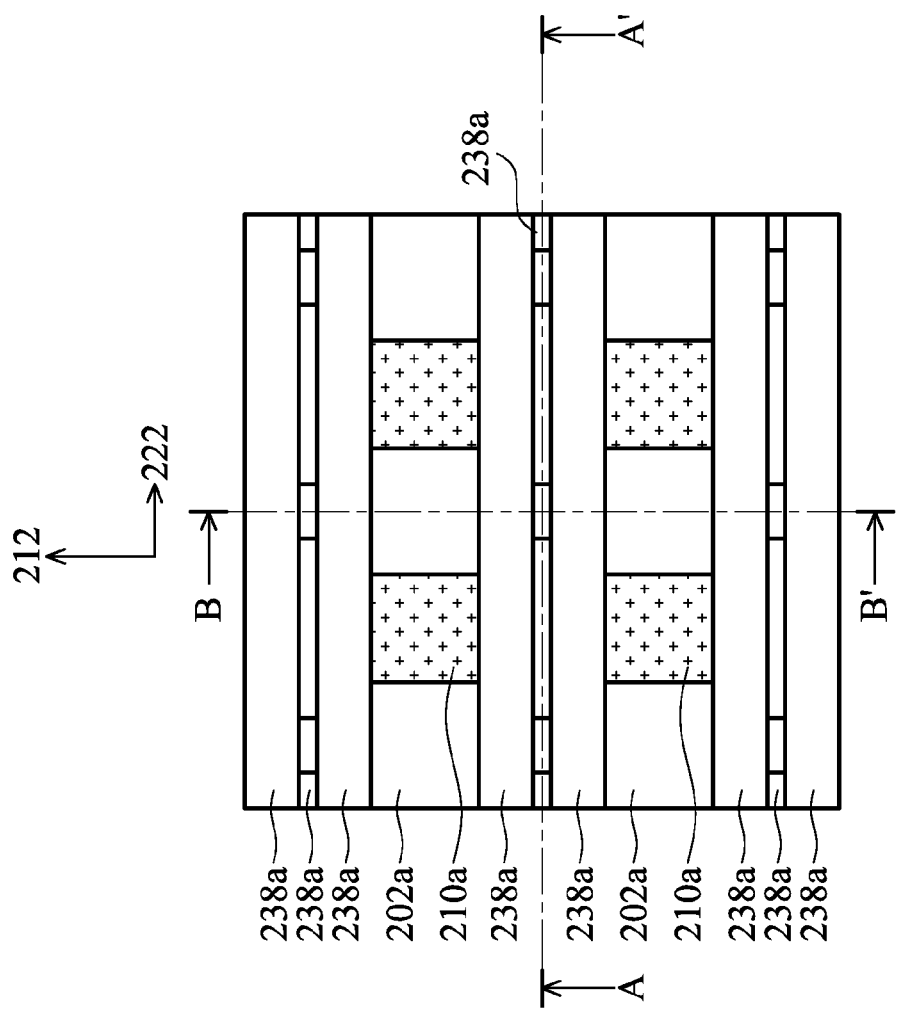
Figure 15C:
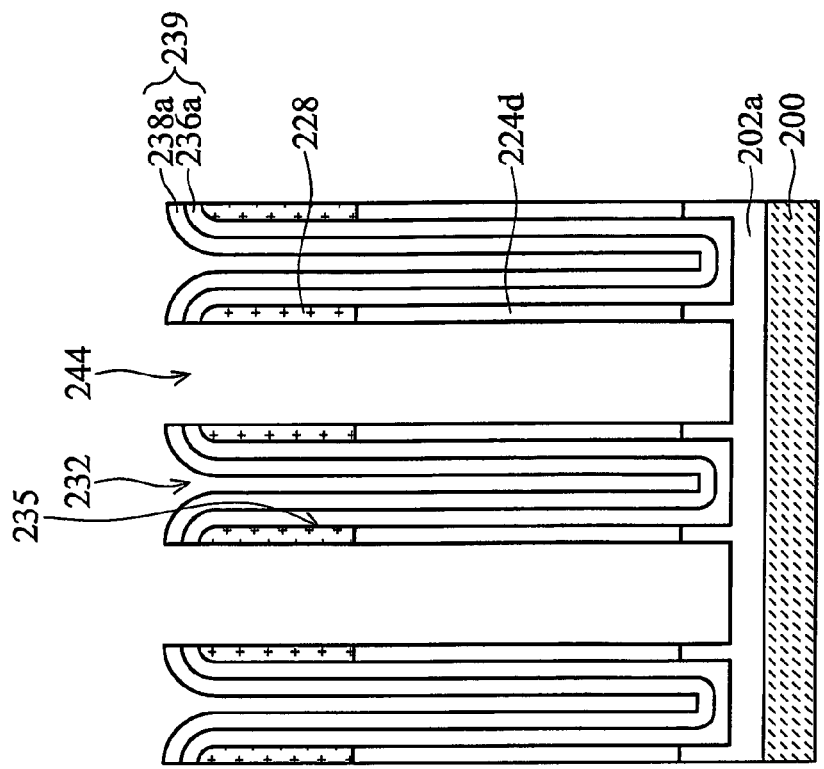
Figure 15B:
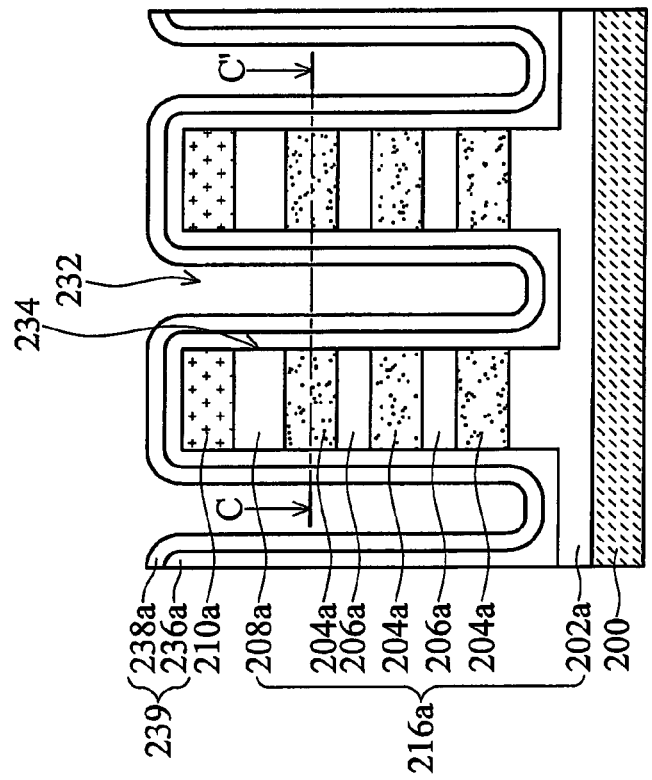
Figure 15D:
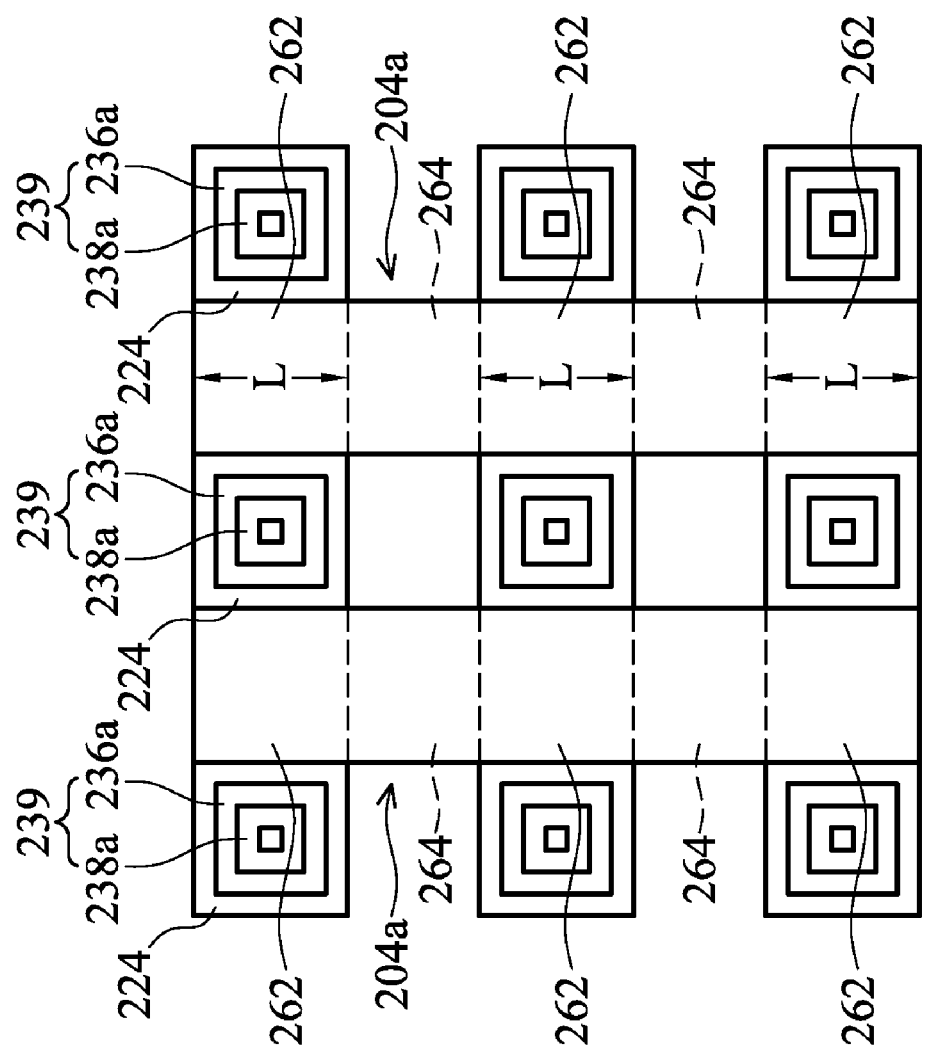
FIGS. 15d, 16d, 17d and 19d show cross sections taken along line C-C' of FIGS. 15b, 16b, 17b and 19b.
Figure 16A:
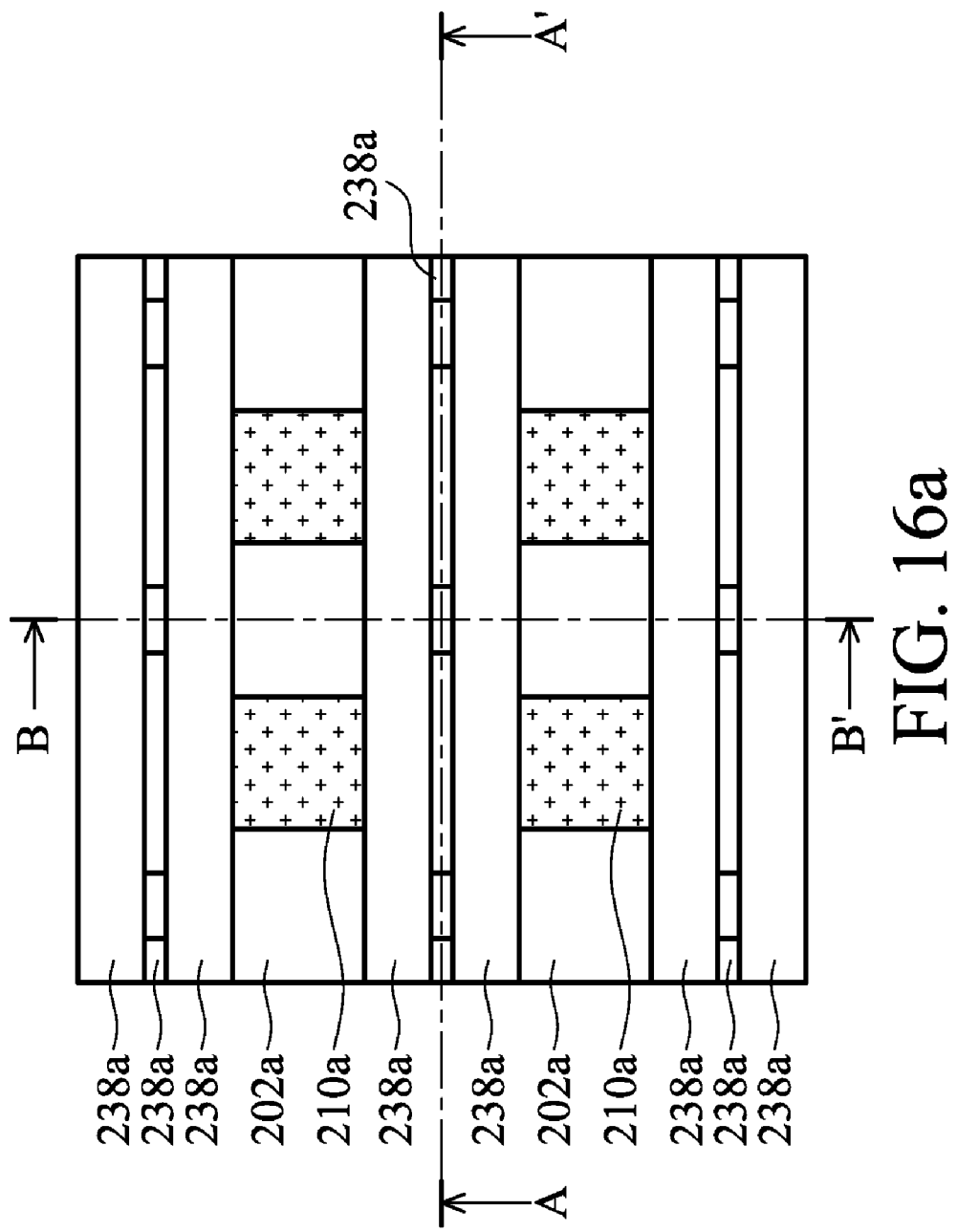
Figure 16C:
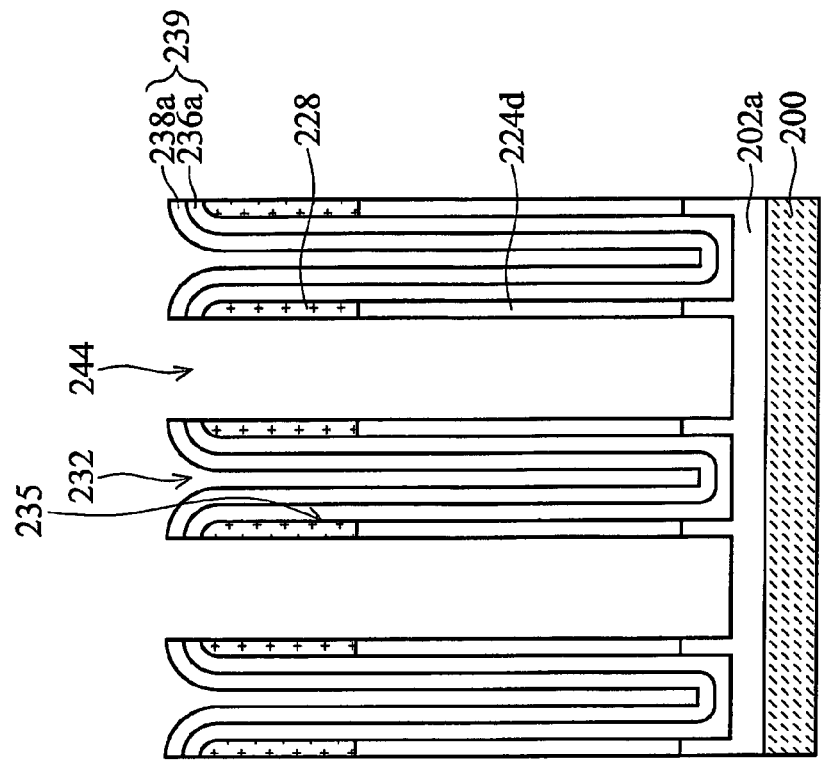
Figure 16B:
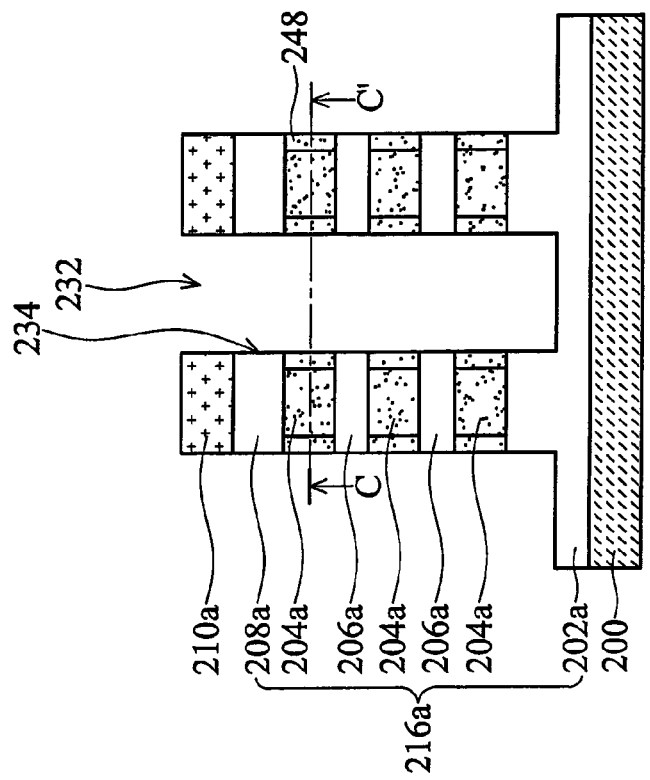
Figure 16D:
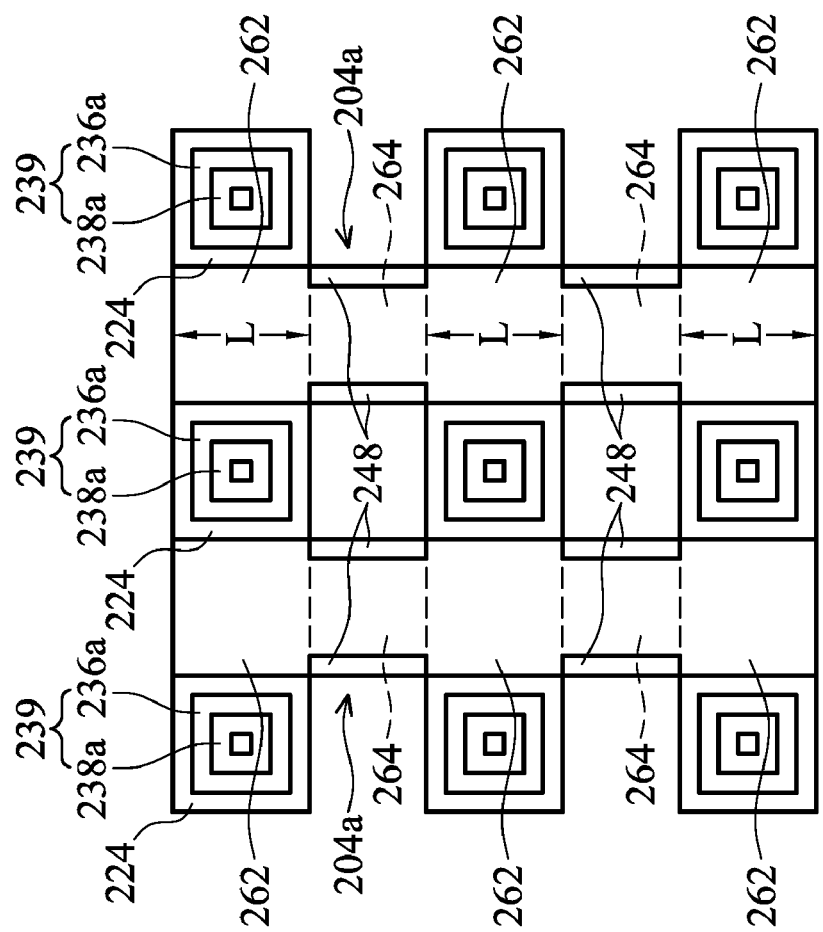
Figure 17A:
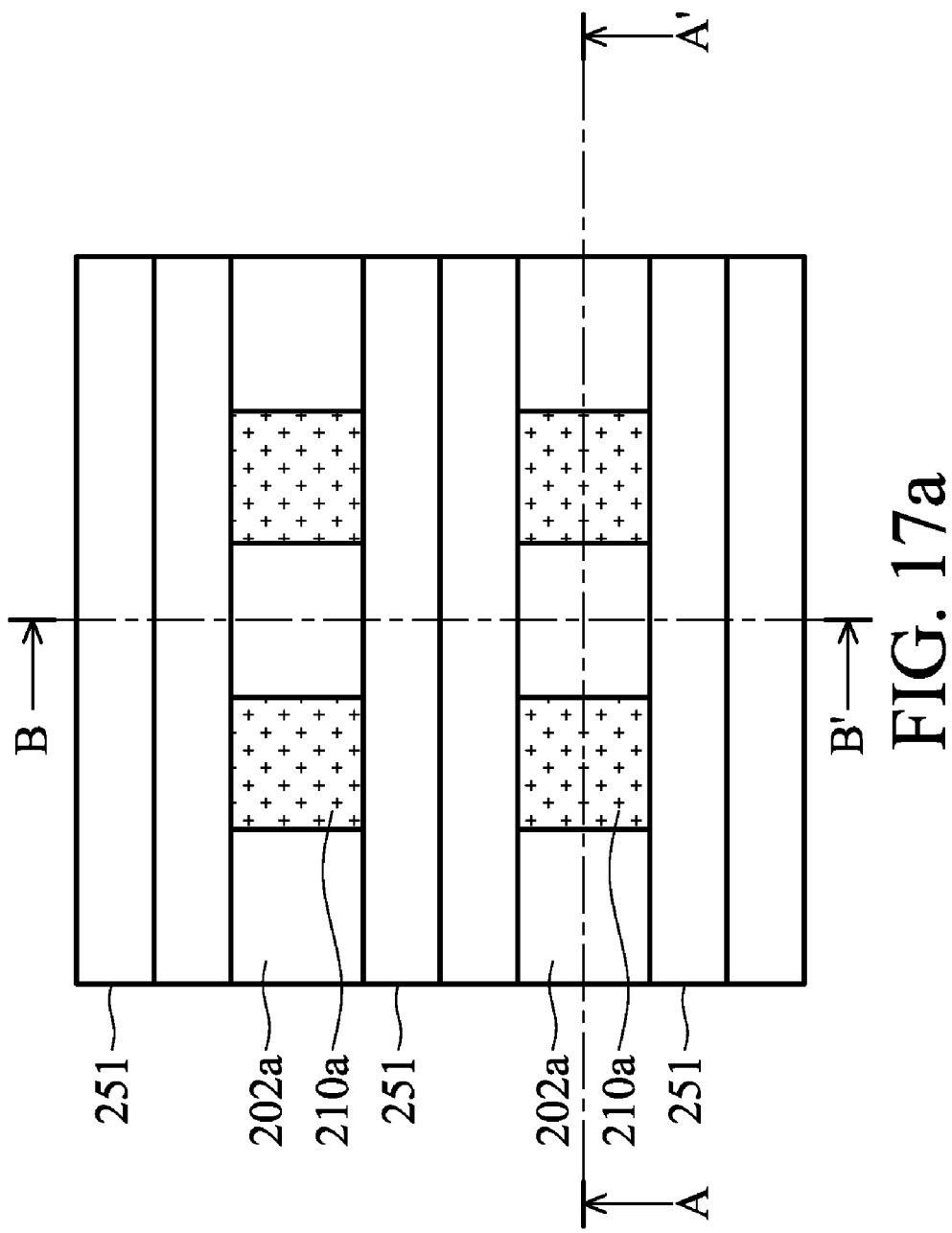
Figure 17C:
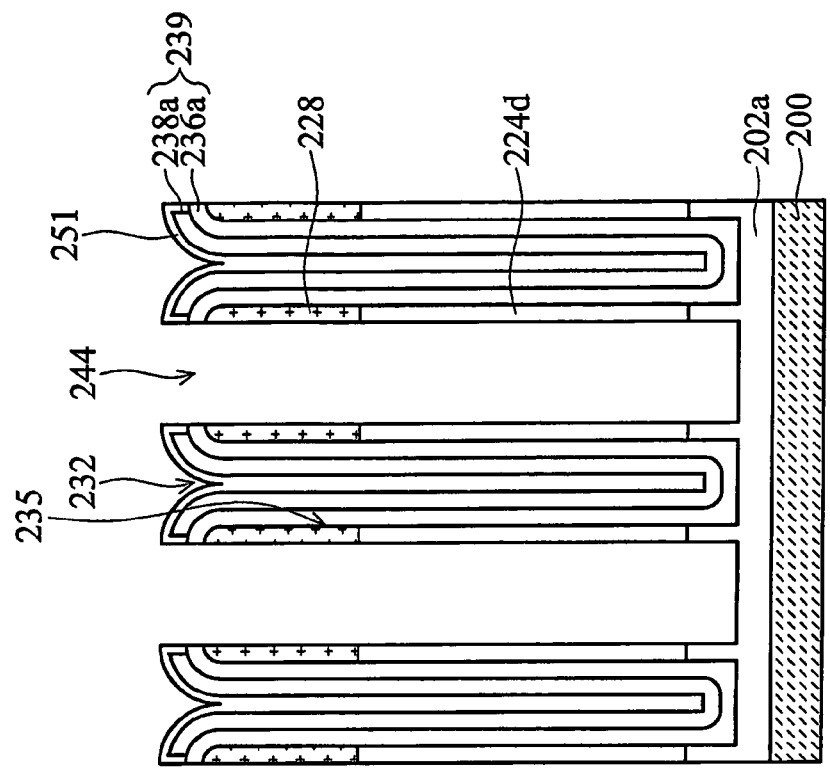
Figure 17B:
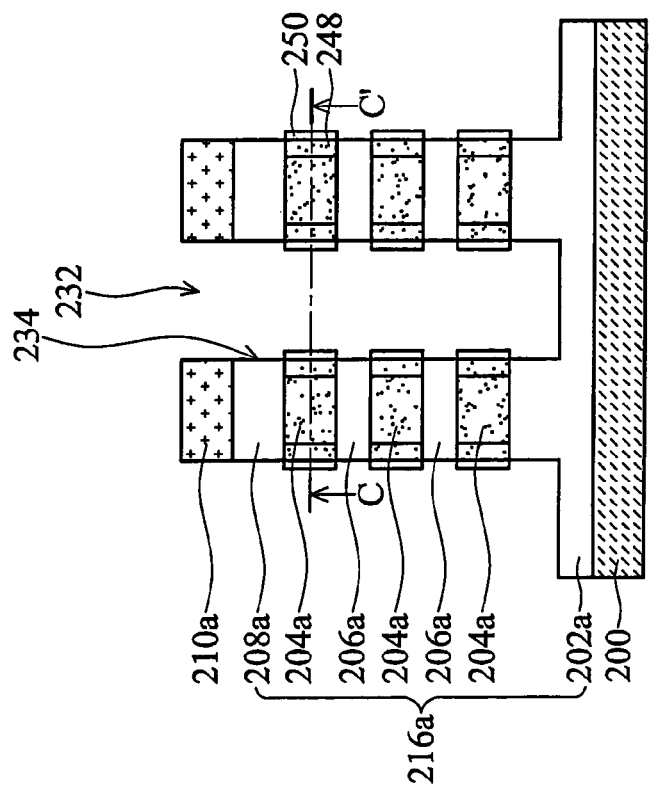
Figure 17D:
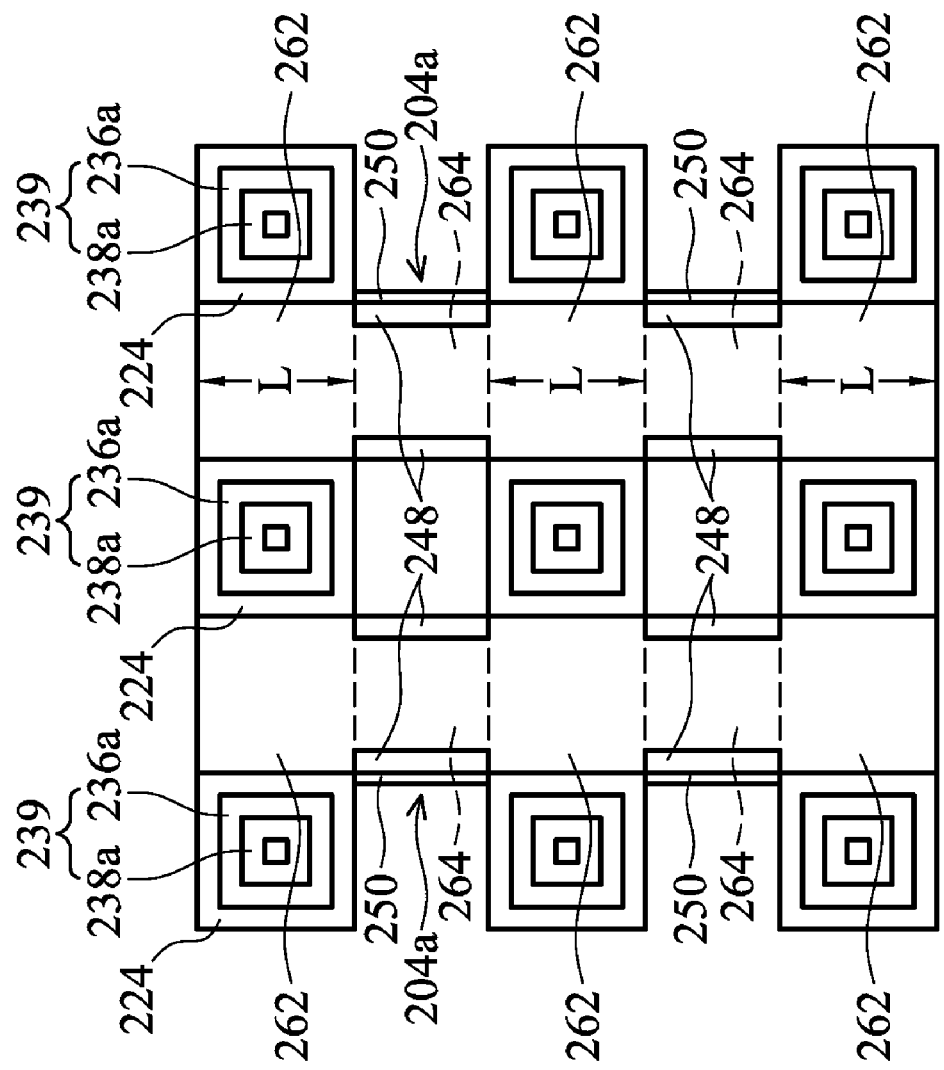

Referring to FIGS. 15a, 15b, 15c and 15d, a supporting insulating layer 224d underlying the first insulating spacers 228 may be formed by removing the patterned second hard masking layer 226a and a portion of the supporting insulating layer 224c until the bottom insulating layer 202a and the first patterned hard masking layer 210a are exposed. The supporting insulating layer 224d is formed by removing the patterned second hard masking layer 226a and a portion of the supporting insulating layer 224c in sequence using the first gate conductive layer 238a as an etching hard mask, wherein the insulating layer 240a and a portion of the supporting insulating layer 224c are removed at the same time. After performing the aforementioned process, a first gate structure 239 is formed along the second direction 222 on the substrate 200, covering a portion of the sidewall 234 of the lamination structure 216a. The first gate structure 239 may comprises the inner first gate insulating layer 236a and the outer first gate conductive layer 238a. The first gate structure 239 is extended from the substrate 200 to a top surface of the lamination structure 216a as shown in FIG. 15b. FIG. 15d illustrates a top view of each isolated conductive layer 204a. The first gate structure 239 is formed along the second direction 222 on a sidewall of the first region 262 of the conductive layer 204a. The first gate structure 239 has a length L defining a channel length of an exemplary embodiment of a semiconductor device of the invention. The first region 262 may serve as a channel region of an exemplary embodiment of a semiconductor device of the invention.

Referring to FIGS. 16a, 16b, 16c and 16d, a plurality of source/drain doped regions 248 are formed on the second region 264 of each the conductive layer 204a. The source/drain doped regions 248 are also on each side of the first gate structure 239. In this embodiment, an ion implantation or a thermal diffusion process is performed to dope impurities into the conductive layers 204a, and a subsequent annealing process is next performed to form the source/drain doped regions 248. Alternatively, the source/drain doped regions 248 comprising polysilicon may be formed on the second region 264 by selective epitaxial growth method. The source/drain doped regions 248 may have different conductive types from the conductive layers 204a. And the second region 264 may serve as a source/drain region of an exemplary embodiment of a semiconductor device of the invention. A metal silicide layer (not shown) may be optionally formed on the first gate conductive layer 238a or on a plurality of the source/drain doped regions 248. One exemplary embodiment of a semiconductor device of the invention, such as a NAND flash memory device, a NOR flash memory device or a transistor, is thus completed.

FIGS. 17a, 17b, 17c and 17d to FIGS. 19a, 19b, 19c and 19d show an optional process of forming a second gate structure. Referring to FIGS. 17a, 17b, 17c and 17d, a second gate insulating layer 250 is formed on the second area 264 of each the conductive layer 204a. During formation of the second gate insulating layer 250, a third gate insulating layer 251 is formed on the first gate conductive layer 238a. The second gate insulating layer 250 and the third gate insulating layer 251 may be formed by methods, such as thermal oxidation, low pressure chemical vapor deposition (LPCVD) or atomic layer chemical vapor deposition (ALD). The second gate insulating layer 250 and the third gate insulating layer 251 may comprise silicon dioxide ($SiO_2$), oxide-nitride-oxide (ONO), nitride-oxide (NO) or silicon nitride ($Si_3N_4$). Alternatively, the second gate insulating layer 250 and the third gate insulating layer 251 may also comprise high dielectric constant (k) (k>8) dielectric materials, such as, aluminum oxide ($Al_2O_3$), hafnium oxide ($HfO_x$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof. In one embodiment, when the first gate insulating layer 236a is a composite layer of a floating gate insulating layer, a floating gate layer and an inter-gate dielectric layer of a memory device, for example, oxide-nitride-oxide (ONO), the second gate insulating layer 250 or the third gate insulating layer 251 is a gate insulating layer of a semiconductor device, for example, silicon dioxide ($SiO_2$). Alternatively, when the first gate insulating layer 236a is a gate insulating layer of a semiconductor device, for example, silicon dioxide ($SiO_2$), the second gate insulating layer 250 or the third gate insulating layer 251 is a composite layer of a floating gate insulating layer, a floating gate layer and an inter-gate dielectric layer of a memory device, for example, oxide-nitride-oxide (ONO).

Referring to FIGS. 18a, 18b and 18c, a second gate conductive layer 254 is blanketly formed filling into the trench 232. The second gate conductive layer 254 covers the second gate insulating layer 250, and the top and the sidewall 234 of the lamination structure 216a. The second gate conductive layer 254 also covers the third gate insulating layer 251 on the first gate structure 239, the first insulating spacer 228 and the underlying supporting insulating layer 224d. The second gate conductive layer 254 may be formed by a deposition process, such as low pressure chemical vapor deposition (LPCVD). The second gate conductive layer 254 may comprise a single crystalline semiconductor layer, a polycrystalline semiconductor layer or an amorphous semiconductor layer, such as a single crystalline silicon layer, a polysilicon layer or an amorphous silicon layer. The conductive layer 204 may comprise an n-type impurities doped semiconductor layer or a p-type impurities doped semiconductor layer. The n-type impurities may comprise phosphorous (P) or arsenic (As), and the p-type impurities may comprise boron (B) or difluoroborane ($BF_2$). The conductive layer 204 and the first gate insulating layer 236 may comprise the same conductive type.

Figure 19A:
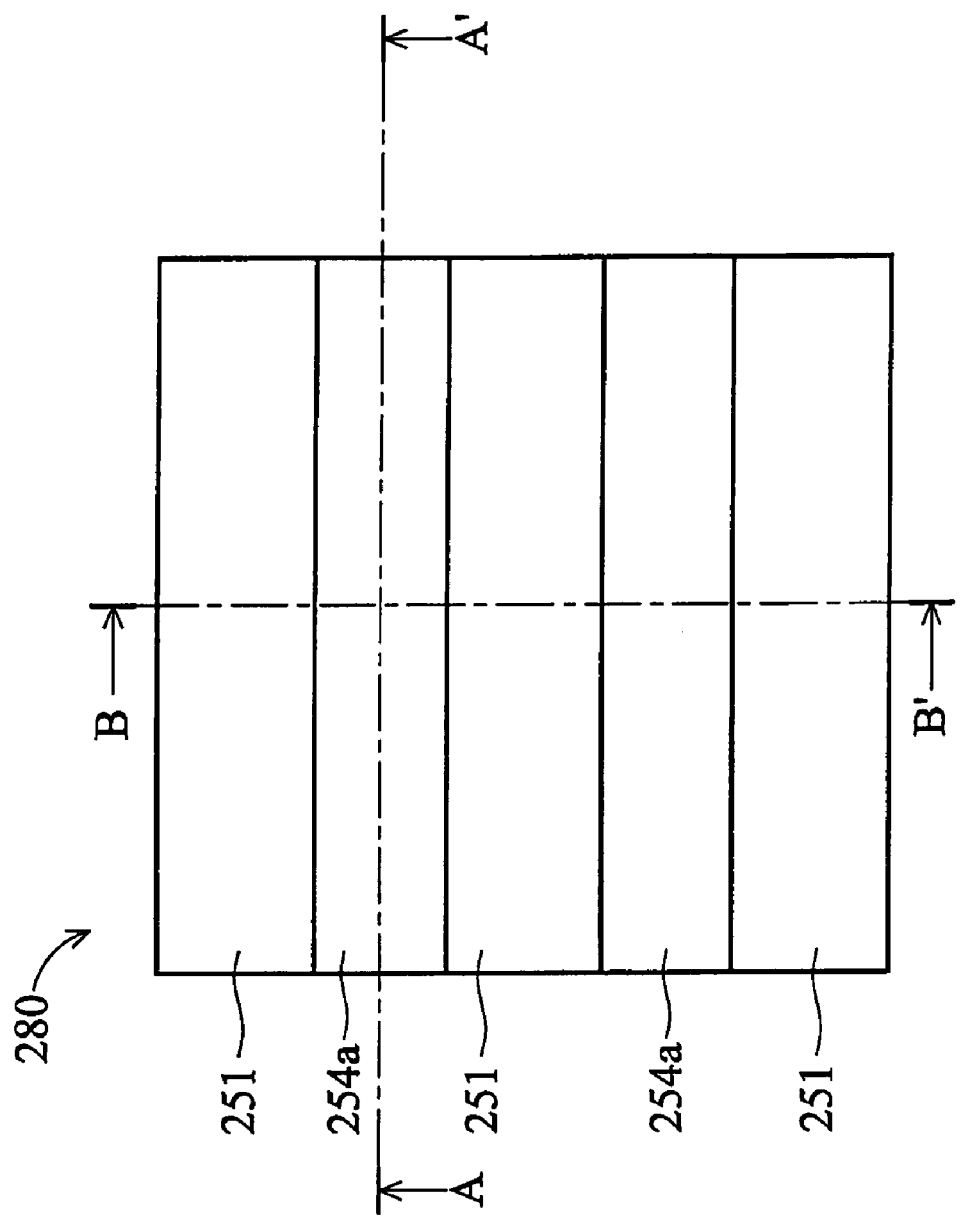
Figure 19B:
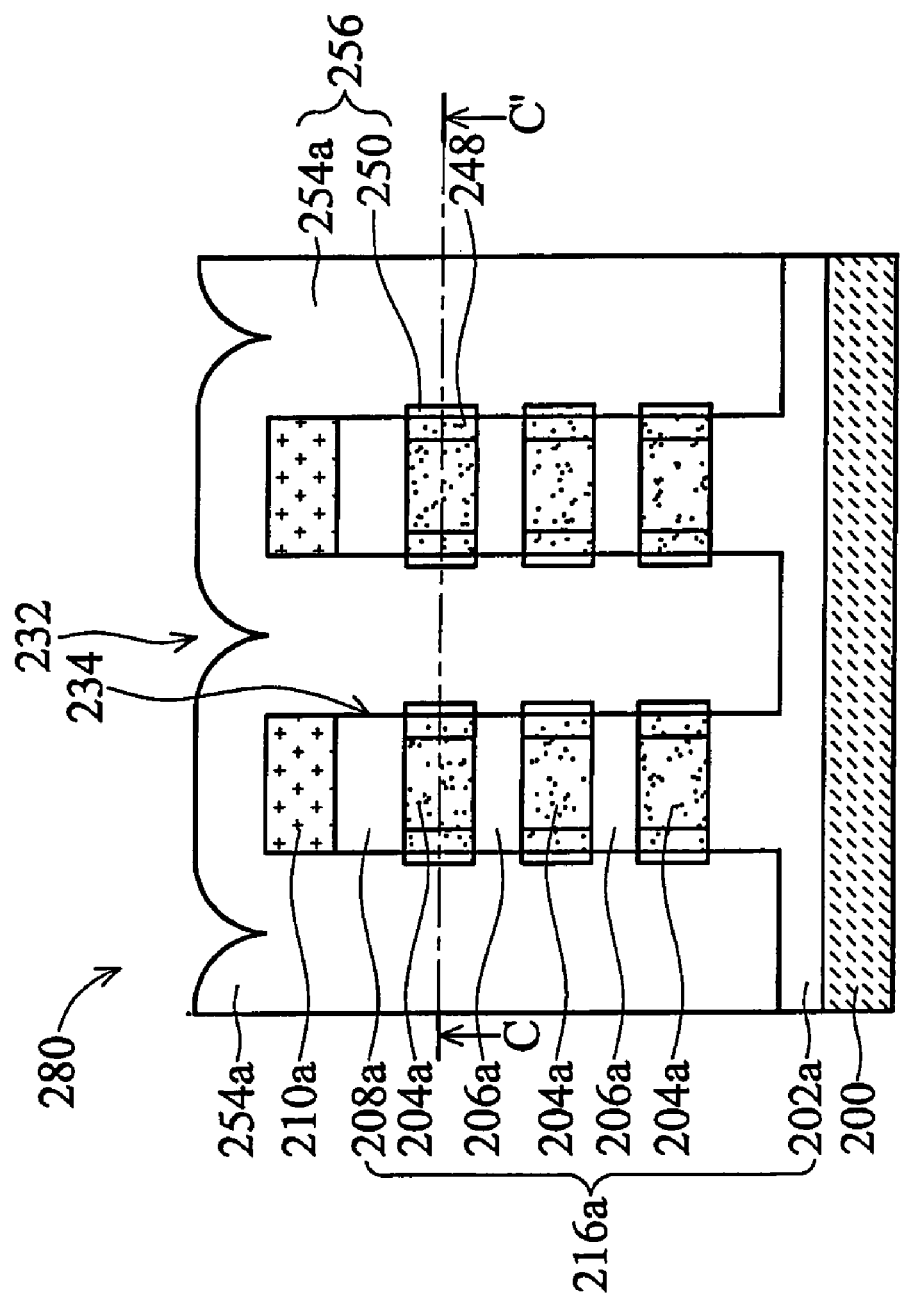
Figure 19C:
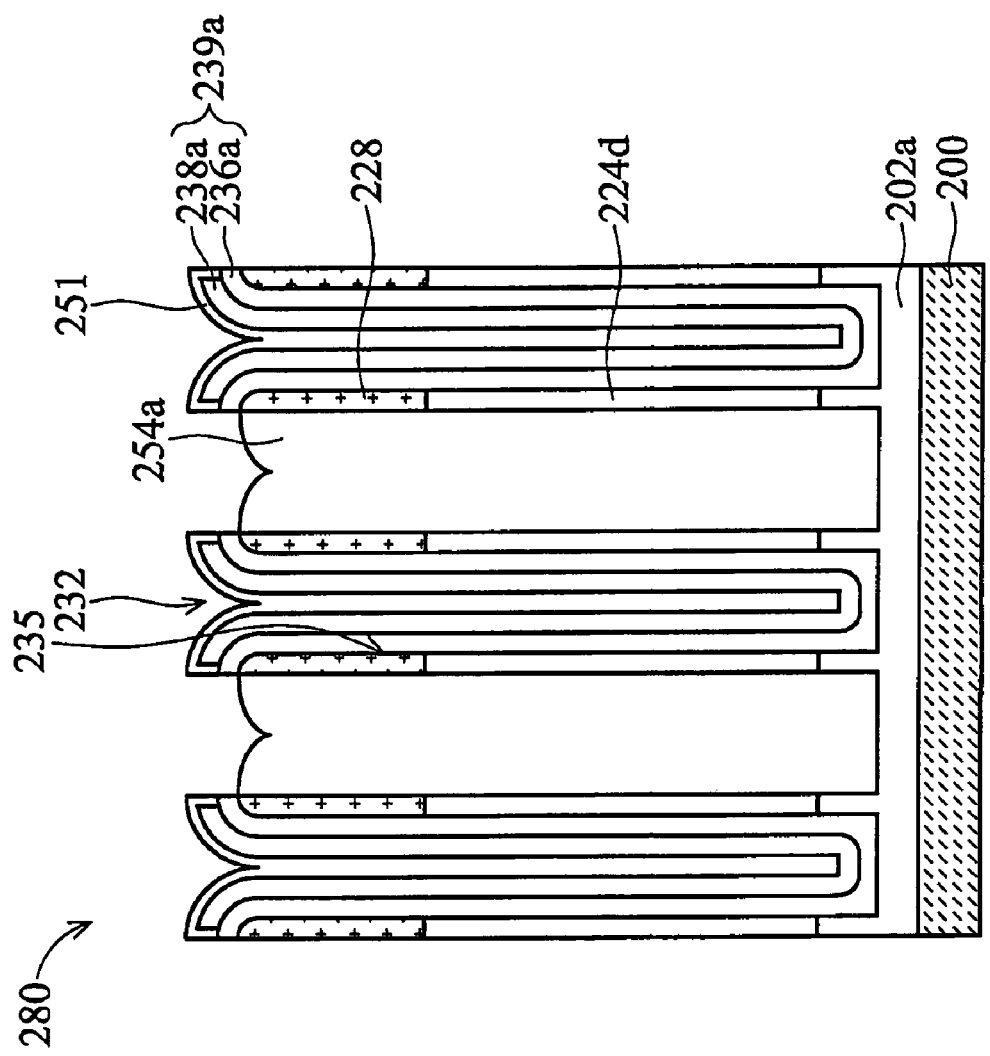
Figure 19D:
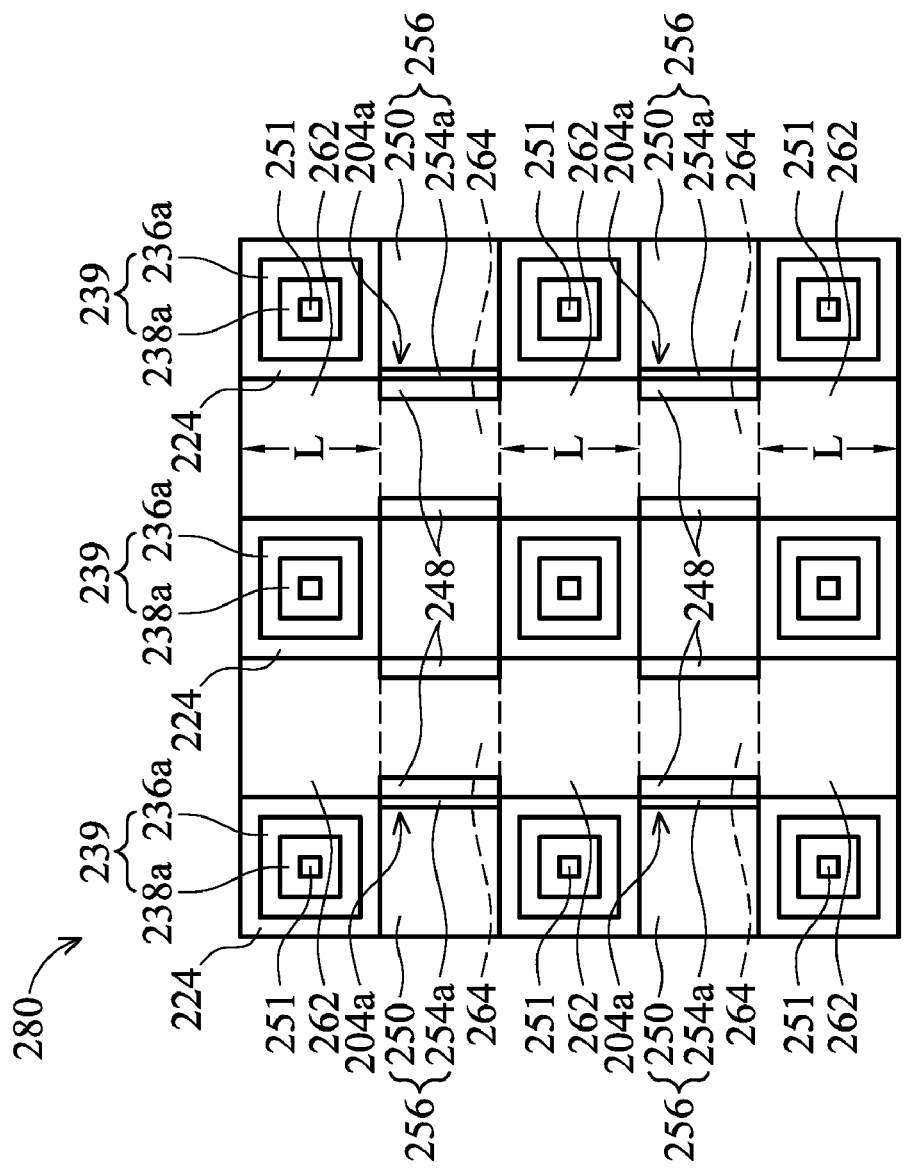

Referring to FIGS. 19a, 19b, 19c and 19d, second gate structure 256 are formed on the second regions 264 of each conductive layer 204a by removing a portion of the second gate conductive layer 254 until the first gate structure 239 is exposed. The second gate structure 256 comprises the second gate insulating layer 250 and the second gate conductive layer 254a. The second gate conductive layer 254a may be formed by removing a portion of the second gate conductive layer 254 using an etching back process. As shown in FIG. 19c, the first gate structure 239 and the second gate structure 256 are isolated from each other by the supporting insulating layer 224d and the first insulating spacer 228, to avoid short-circuiting problems. A metal silicide layer (not shown) may be optionally formed on the second gate conductive layer 254a, to form a gate structure of a semiconductor device, such as, a NAND flash memory device, NOR flash memory device or a transistor. Thus, the exemplary embodiment of a semiconductor device 280 of the invention is completed.

In one embodiment of the semiconductor device 280, one sidewall of each conductive layer 204a of the lamination structure 216a, the first gate structure 239 on the first region 262, and the source/drain region 248 on the second region 264 construct a bit of the semiconductor device 280. Therefore, each semiconductor device 280 has six bits as each lamination structure 216a has three conductive layers 204a. In other words, a bit number of the semiconductor device 280 can be defined by the number of layers of the conductive layers 204a of the lamination structure 216a. A multi-bit cell (MLC) unit requirement can be achieved by controlling layer number or layer thickness of the insulating layers 206a and the conductive layers 204a of the lamination structure 216a.

In one embodiment of the semiconductor device 280, the first gate structure 239 may serve as a gate structure of a non-volatile memory device, such as a NAND flash memory device or a NOR flash memory device. The first gate insulating layer 236a, for example, oxide-nitride-oxide (ONO), may serve as a floating gate insulating layer, a floating gate layer and an inter-gate dielectric layer of a non-volatile memory device, respectively. The first gate conductive layer 238a, for example, a polysilicon layer, may serve as a control gate conductive layer of a non-volatile memory device. The second gate structure 256 may serve as a select gate structure of a non-volatile memory device. The second gate insulating layer 250, for example, silicon dioxide ($SiO_2$), may serve as a select gate insulating layer of a non-volatile memory device. The second gate conductive layer 245a, for example, a polysilicon layer, may serve as a select gate conductive layer of a non-volatile memory device. Alternatively, the first gate structure 239 may serve as a select gate structure of a non-volatile memory device, wherein the first gate insulating layer 236a, for example, silicon dioxide ($SiO_2$), may serve as a select gate insulating layer of a non-volatile memory device. The first gate conductive layer 238a, for example, a polysilicon layer, may serve as a select gate conductive layer of a non-volatile memory device. The second gate structure 256 may serve as a gate structure of a non-volatile memory device, such as a NAND flash memory device or a NOR flash memory device, wherein the second gate insulating layer 250, for example, oxide-nitride-oxide (ONO), may serve as a floating gate insulating layer, a floating gate layer and an inter-gate dielectric layer of a memory device of a non-volatile memory device, respectively. The second gate conductive layer 245a, for example, a polysilicon layer, may serve as a control gate conductive layer of a non-volatile memory device.

In another embodiment of the semiconductor device 280, the first gate structure 239 may serve as a gate structure of a transistor, wherein the first gate insulating layer 236a, for example, silicon dioxide ($SiO_2$), may serve as a gate insulating layer of a transistor. The first gate conductive layer 238a, for example, a polysilicon layer, may serve as a gate conductive layer of a transistor. Therefore, the semiconductor device 280 may comprise a NAND flash memory device, a NOR flash memory device or a transistor.

One exemplary embodiment of the semiconductor device 280 mainly comprises a substrate 200. A lamination structure 216a is formed on the substrate 200 along a first direction 212, wherein the lamination structure 216a comprises a plurality of conductive layers 204a arranged from bottom to top and separated from each other, and each of the conductive layer 204a has a channel region 262 and an adjacent source/drain region 264 along the first direction 212. A first gate structure 239 on a sidewall of the channel region 262 of each conductive layer is formed, wherein the first gate structure 239 comprises an inner first gate insulating layer 236a and an outer first gate conductive layer 238a.

Some advantages an exemplary embodiment of the semiconductor device are described in the following. The number of masks used in the fabricating process for the semiconductor device of the invention is the same with that of the conventional semiconductor device. Each mask for fabricating the semiconductor device is used one time to produce a multi-level cell (MLC) semiconductor device. An annealing process with a relatively higher temperature (>1000° C.) utilized for the conductive layer of the lamination structure may be excluded from the fabricating processes of the subsequence first gate structure, the source/drain regions or the second gate structure. Compared with the conventional process, each conductive layer the lamination structure, which construct bits of the semiconductor device, may have substantially the same electrical performances with each other. The conductive layers of the lamination structure, which construct bits of the semiconductor device, is laminated in one time to save process steps. Thus, process yield is improved. Additionally, the semiconductor device of the invention can have a relatively higher integrated density along perpendicular or parallel directions to the substrate. Each bit of the semiconductor device can have substantially the same electrical performances with each other. A multi-bit cell (MLC) unit requirement can be achieved by controlling layer number or layer thickness of the conductive layers of the lamination structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate;
a lamination structure on the substrate along a first direction, wherein the lamination structure comprises a plurality of conductive layers arranged from bottom to top and separated from each other, and each of the conductive layers has a channel region and an adjacent source/drain doped region along the first direction;
a first gate structure on a sidewall of the channel region of each conductive layer, wherein the first gate structure comprises an inner first gate insulating layer and an outer first gate conductive layer; and
a second gate structure directly covering the source/drain doped region, wherein the first gate structure and the second gate structure are different structures and isolated from each other, wherein the first gate structure and the second gate structure are isolated from each other by an insulating layer extending along a second direction.

2. The semiconductor device as claimed in claim 1, wherein the lamination structure further comprises a plurality of insulating layers formed by alternative stacking of the conductive layers.

3. The semiconductor device as claimed in claim 1, wherein the conductive layer has different conductive type from the first gate structure.

4. The semiconductor device as claimed in claim 1, wherein the first gate structure is formed on the substrate along the second direction substantially perpendicular to the first direction.

5. The semiconductor device as claimed in claim 1, further comprising a metal silicide layer on the first gate conductive layer or on the source/drain doped regions.

6. The semiconductor device as claimed in claim 1 comprises a NAND flash memory, a NOR flash memory or a transistor.

7. The semiconductor device as claimed in claim 1, wherein the first gate structure is extended from the substrate to top of the lamination structure.

8. The semiconductor device as claimed in claim 1, wherein the second gate structure extends along the second direction comprises an inner second gate insulating layer and an outer second gate conductive layer.

9. The semiconductor device as claimed in claim 8, wherein the first gate structure and the second gate structure comprise the same conductive type.

10. The semiconductor device as claimed in claim 8, wherein the first and second gate insulating layers comprise silicon dioxide ($SiO_2$), oxide-nitride-oxide (ONO), nitride-oxide (NO), tantalum oxide ($Ta_2O_5$) or silicon nitride ($Si_3N_4$), or aluminum oxide ($Al_2O_3$), hafnium oxide ($HfO_x$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof.

11. The semiconductor device as claimed in claim 8, wherein the first gate insulating layer is a composite layer of a floating gate insulating layer, a floating gate layer and an inter-gate dielectric layer of a memory device, and the second gate insulating layer is a gate insulating layer of a semiconductor device.

12. The semiconductor device as claimed in claim 8, wherein the second gate insulating layer is a composite layer of a floating gate insulating layer, a floating gate layer and an inter-gate dielectric layer of a memory device, and the first gate insulating layer is a gate insulating layer of a semiconductor device.

13. The semiconductor device as claimed in claim 8, further comprising a metal silicide layer on the second gate conductive layer.

14. The semiconductor device as claimed in claim 8, wherein the second gate structure is used as a gate structure of a NAND flash memory, a NOR flash memory or a transistor.

* * * * *